(12) United States Patent
More

(10) Patent No.: US 12,356,681 B2
(45) Date of Patent: Jul. 8, 2025

(54) SEMICONDUCTOR DEVICE AND METHODS OF MANUFACTURING

(71) Applicant: Taiwan Semiconductor Manufacturing Company Limited, Hsinchu (TW)

(72) Inventor: Shahaji B. More, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 540 days.

(21) Appl. No.: 17/654,517

(22) Filed: Mar. 11, 2022

(65) Prior Publication Data

US 2023/0290822 A1 Sep. 14, 2023

(51) Int. Cl.
| | | |
|---|---|---|
| H10D 62/10 | (2025.01) | |
| H10D 30/01 | (2025.01) | |
| H10D 30/67 | (2025.01) | |
| H10D 64/01 | (2025.01) | |

(52) U.S. Cl.
CPC ......... H10D 62/118 (2025.01); H10D 30/031 (2025.01); H10D 30/6713 (2025.01); H10D 30/6735 (2025.01); H10D 30/6757 (2025.01); H10D 62/115 (2025.01); H10D 64/018 (2025.01)

(58) Field of Classification Search
CPC ......... H01L 29/42392; H01L 29/78618; H01L 29/78696; H01L 29/0665; H01L 29/775; H01L 29/7848; H01L 21/823418; H10D 30/031; H10D 30/6713; H10D 30/6735; H10D 30/6757; H10D 62/118; H10D 62/115; H10D 64/018

See application file for complete search history.

(56) References Cited

U.S. PATENT DOCUMENTS

| | | | | |
|---|---|---|---|---|
| 2015/0303118 | A1* | 10/2015 | Wang | H10D 84/0151 |
| | | | | 257/401 |
| 2021/0066499 | A1* | 3/2021 | Holland | H10D 64/62 |
| 2021/0343578 | A1* | 11/2021 | Chang | H10D 84/038 |
| 2021/0343645 | A1* | 11/2021 | Peng | H10D 84/0149 |
| 2022/0069135 | A1* | 3/2022 | Chu | H10D 30/43 |
| 2022/0181499 | A1* | 6/2022 | Jung | H01L 29/0673 |

* cited by examiner

*Primary Examiner* — Syed I Gheyas
*Assistant Examiner* — Casey Paul Boatman
(74) *Attorney, Agent, or Firm* — Harrity & Harrity, LLP

(57) ABSTRACT

In some implementations, a buffer layer is formed under a source/drain region of a device. A shape of the buffer layer may include a curved top surface having a height that extends to increase coverage of nanosheets of a fin structure of the device. The shape also includes regions having widths that extend towards shallow trench isolation regions of the device. The shape reduces a likelihood of dopants diffusing from the source/drain region into a mesa region of the fin structure. As a result, a performance of the device may be increased by decreasing short channel effects, decreasing an off-current of the device, and decreasing leakage within the device, among other examples.

20 Claims, 29 Drawing Sheets

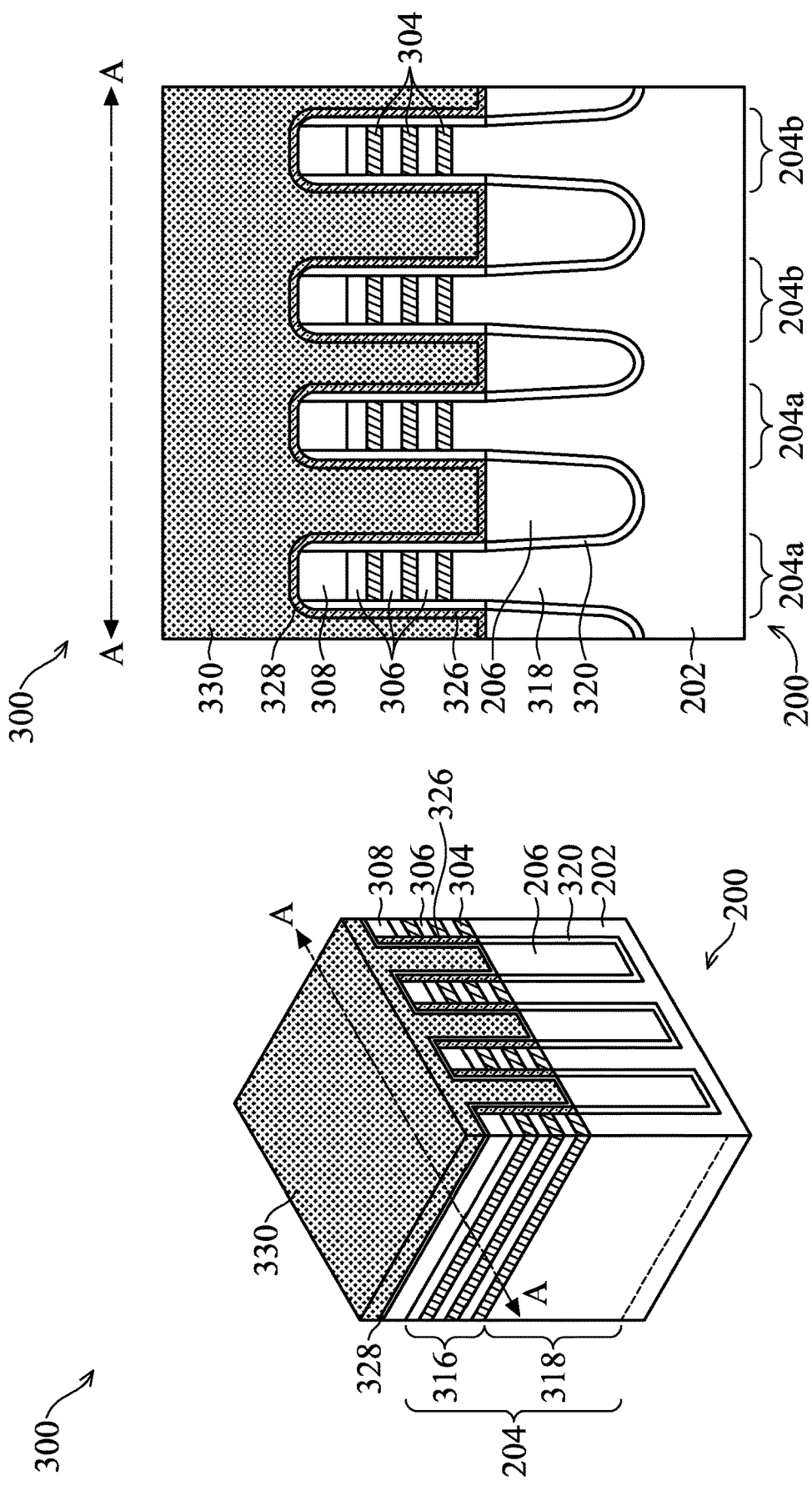

SEMICONDUCTOR DEVICE AND METHODS OF MANUFACTURING

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
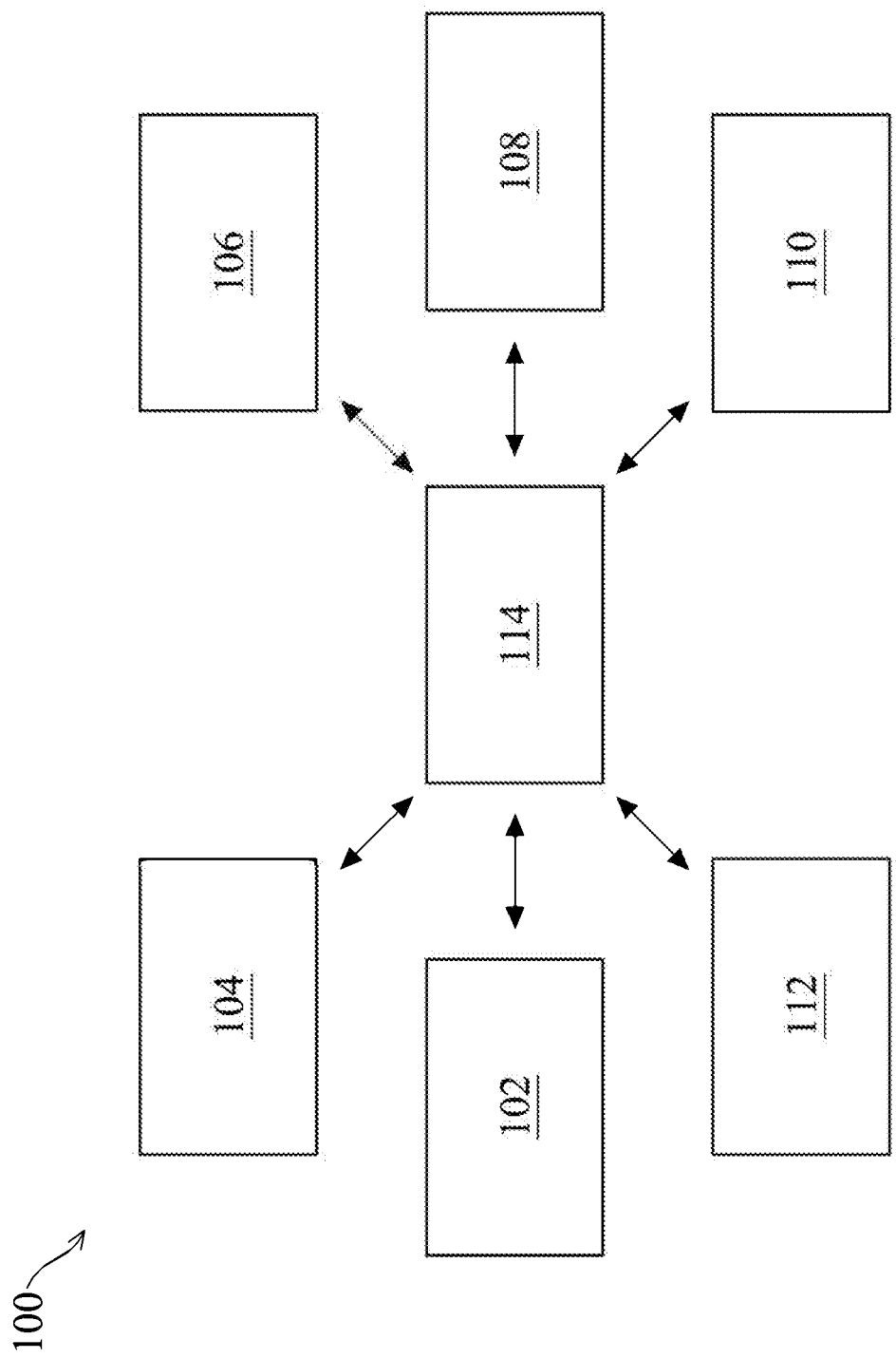
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A source/drain region of a device, such as a nanostructure transistor, may include a doped epitaxial material. In some cases, dopants from the doped epitaxial material may diffuse into a mesa region of a fin structure included in the device. The dopants may increase electron tunneling within the mesa region to reduce a performance of the device by increasing short channel effects (e.g., drain-induced barrier lowering (DIBL)), increasing an off-current of the device, and increasing leakage within the device.

Some implementations described herein provide techniques and semiconductor devices in which a buffer layer is formed under a source/drain region of a device. The buffer layer is configured to reduce, prevent, and/or block leakage or diffusion of dopants from the source/drain region to other areas of the device such as an adjacent mesa region of a fin structure of the device. A shape of the buffer layer may include a curved top surface having a height that is configured to increase coverage of nanosheets of the fin structure. The shape of the buffer layer also includes regions having widths that extend over shallow trench isolation regions of the device and toward adjacent hybrid fin structures.

The height, width, and overall shape of the buffer layer further reduces, prevents, and/or blocks the leakage or diffusion of dopants from the source/drain region into the mesa region of the fin structure. In particular, the height, width, and overall shape of the buffer region is configured such that the buffer layer is fully situated between the source/drain region and the mesa region of the fin structure (e.g., such that the source/drain region is not in direct contact with the mesa region). This prevents dopants of the epitaxial material of the source/drain region from leaking or diffusing into corners of the mesa region under the nanosheets of the fin structure. As a result, a performance of the device may be increased by decreasing short channel effects (e.g., DIBL), decreasing an off-current of the device, and decreasing leakage within the device.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 includes a programmed device that is configured to travel a particular path and/or may operate semi-autonomously or autonomously. In some implementations, the semiconductor processing environment 100 includes a plurality of wafer/die transport tools 114.

The wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, and as described in connection with FIGS. 2, 3A-3U, 4A-4I, 5A-5D, and elsewhere herein, the semiconductor processing tools 102-112 may perform a method including one or more processing operations. The method may form structures and/or regions of a nanostructure transistor.

For example, the method may include forming a plurality of nanostructure channels over a substrate. In some implementations, the plurality of nanostructure channels are formed in a direction perpendicular to the substrate. The method may further include forming a layer of an epitaxial material in a recess adjacent to the nanostructure channels. In some implementations, a portion of the layer of the epitaxial material extends towards a hybrid fin structure that is adjacent to the plurality of nanostructure channels and into a shallow trench isolation region. The method further includes removing a plurality of sacrificial layers between the plurality of nanostructure channels. The method further includes forming a gate structure wrapping around the plurality of nanostructure channels after removing the plurality of sacrificial layers.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
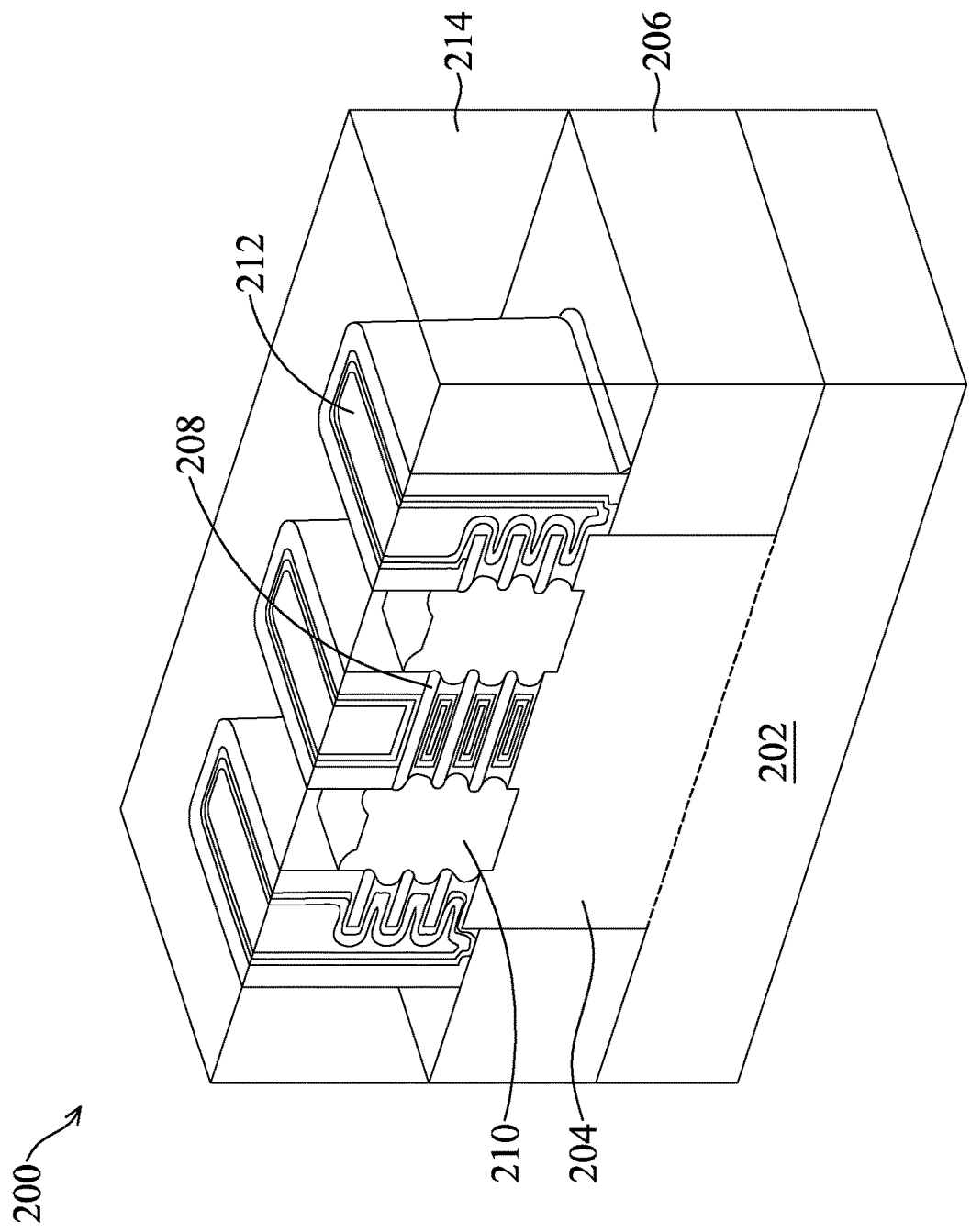
FIG. 2 is a diagram of an example semiconductor structure described herein.
Figures 3A, 3B:
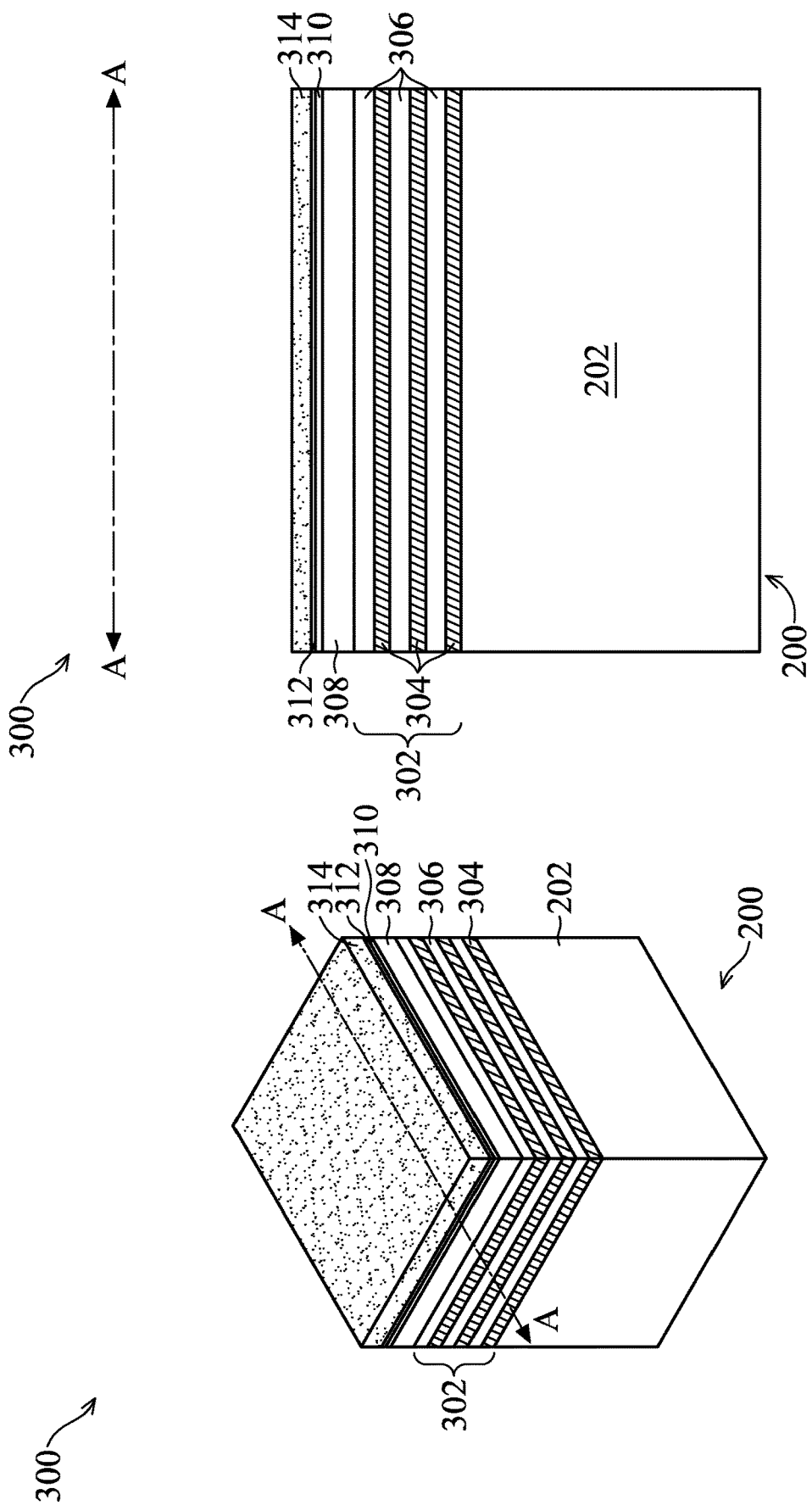
FIGS. 3A-3U, 4A-4I, 5A-5D, and 6 are diagrams of example implementations described herein.

FIG. 2 is a diagram of an example semiconductor device 200 described herein. The semiconductor device 200 includes one or more transistors. The one or more transistors may include nanostructure transistor(s) such as nanowire transistors, nanosheet transistors, gate-all-around (GAA) transistors, multi-bridge channel transistors, nanoribbon transistors, and/or other types of nanostructure transistors. The semiconductor device 200 may include one or more additional devices, structures, and/or layers not shown in FIG. 2. For example, the semiconductor device 200 may include additional layers and/or dies formed on layers above and/or below the portion of the semiconductor device 200 shown in FIG. 2. Additionally, or alternatively, one or more additional semiconductor structures and/or semiconductor devices may be formed in a same layer of an electronic device or integrated circuit (IC) that includes the semiconductor device, with a lateral displacement, as the semiconductor device 200 shown in FIG. 2. FIGS. 3A-3U are schematic cross-sectional views of various portions of the semiconductor device 200 illustrated in FIG. 2, and correspond to various processing stages of forming nanostructure transistors of the semiconductor device 200.

The semiconductor device 200 includes a semiconductor substrate 202. The semiconductor substrate 202 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The semiconductor substrate 202 may include various layers, including conductive or insulating layers formed on a semiconductor substrate. The semiconductor substrate 202 may include a compound semiconductor and/or an alloy semiconductor. The semiconductor substrate 202 may include various doping configurations to satisfy one or more design parameters. For example, different doping profiles (e.g., n-wells, p-wells) may be formed on the semiconductor substrate 202 in regions designed for different device types (e.g., p-type metal-oxide semiconductor (PMOS) nanostructure transistors, n-type metal-oxide semiconductor (NMOS) nanostructure transistors). The suitable doping may include ion implantation of dopants and/or diffusion processes. Further, the semiconductor substrate 202 may include an epitaxial layer (epi-layer), may be strained for performance enhancement, and/or may have other suitable enhancement features. The semiconductor substrate 202 may include a portion of a semiconductor wafer on which other semiconductor devices are formed.

Fin structures 204 are included above (and/or extend above) the semiconductor substrate 202. A fin structure 204 provides a structure on which layers and/or other structures of the semiconductor device 200 are formed, such as epitaxial regions and/or gate structures, among other examples. In some implementations, the fin structures 204 include the same material as the semiconductor substrate 202 and are formed from the semiconductor substrate 202. In some implementations, the fin structures 204 include a silicon (Si) material or another elementary semiconductor material such as germanium (Ge). In some implementations, the fin structures 204 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof.

The fin structures 204 are fabricated by suitable semiconductor process techniques, such as masking, photolithography, and/or etch processes, among other examples. As an example, the fin structures 204 may be formed by etching a portion of the semiconductor substrate 202 away to form recesses in the semiconductor substrate 202. The recesses may then be filled with isolating material that is recessed or etched back to form shallow trench isolation (STI) regions 206 above the semiconductor substrate 202 and between the fin structures 204. Other fabrication techniques for the STI regions 206 and/or for the fin structures 204 may be used. The STI regions 206 may electrically isolate adjacent fin structures 204 and may provide a layer on which other layers and/or structures of the semiconductor device 200 are formed. The STI regions 206 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The STI regions 206 may include a multi-layer structure, for example, having one or more liner layers.

The semiconductor device 200 includes a plurality of channels 208 that extend between, and are electrically coupled with, source/drain regions 210. The channels 208 include silicon-based nanostructures (e.g., nanosheets or nanowires, among other examples) that function as the semiconductive channels of the nanostructure transistor(s) of the semiconductor device 200. The channels 208 may include silicon germanium (SiGe) or another silicon-based material. The source/drain regions 210 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the semiconductor device 200 may include p-type metal-oxide semiconductor (PMOS) nanostructure transistors that include p-type source/drain regions 210, n-type metal-oxide semiconductor (NMOS) nanostructure transistors that include n-type source/drain regions 210, and/or other types of nanostructure transistors.

In some implementations, the semiconductor device 200 includes a plurality of types of fin structures. For example, the fin structures 204 may be referred to as active fins in that the channels 208 and source/drain regions 210 are formed and included over the fin structures 204. Another type of fin structure includes hybrid fin structures. The hybrid fin structures may also be referred to as dummy fins, H-fins, or non-active fins, among other examples. Hybrid fin structures may be included between adjacent fin structures 204 (e.g., between adjacent active fin structures). The hybrid fin structures extend in a direction that is approximately parallel to the fin structures 204.

Hybrid fin structures are configured to provide electrical isolation between two or more structures and/or components included in the semiconductor device 200. In some implementations, a hybrid fin structure is configured to provide electrical isolation between two or more fin structures 204 (e.g., two or more active fin structures). In some implementations, a hybrid fin structure is configured to provide electrical isolation between two or more source/drain regions 210. In some implementations, a hybrid fin structure is configured to provide electrical isolation between two or more gate structures or two or more portions of a gate structure. In some implementations, a hybrid fin structure is configured to provide electrical isolation between a source/drain region 210 and a gate structure.

A hybrid fin structure may include a plurality of types of dielectric materials. A hybrid fin structure may include a combination of one or more low dielectric constant (low-k) dielectric materials (e.g., a silicon oxide ($SiO_x$) and/or a silicon nitride ($Si_xN_y$), among other examples) and one or more high dielectric constant (high-k) dielectric materials (e.g., a hafnium oxide ($HfO_x$) and/or other high-k dielectric material).

At least a subset of the channels 208 extend through one or more gate structures 212. The gate structures 212 may be formed of one or more metal materials, one or more high dielectric constant (high-k) materials, and/or one or more other types of materials. In some implementations, dummy gate structures (e.g., polysilicon (PO) gate structures or another type of gate structures) are formed in place of (e.g., prior to formation of) the gate structures 212 so that one or more other layers and/or structures of the semiconductor device 200 may be formed prior to formation of the gate structures 212. This reduces and/or prevents damage to the gate structures 212 that would otherwise be caused by the formation of the one or more layers and/or structures. A replacement gate process (RGP) is then performed to remove the dummy gate structures and replace the dummy gate structures with the gate structures 212 (e.g., replacement gate structures).

As further shown in FIG. 2, portions of a gate structure 212 are formed in between pairs of channels 208 in an alternating vertical arrangement. In other words, the semiconductor device 200 includes one or more vertical stacks of alternating channels 208 and portions of a gate structure 212, as shown in FIG. 2. In this way, a gate structure 212 wraps around an associated channel 208 on all sides of the channel 208 which increases control of the channel 208, increases drive current for the nanostructure transistor(s) of the semiconductor device 200, and reduces short channel effects (SCEs) for the nanostructure transistor(s) of the semiconductor device 200.

Some source/drain regions 210 and gate structures 212 may be shared between two or more nanoscale transistors of the semiconductor device 200. In these implementations, one or more source/drain regions 210 and a gate structure 212 may be connected or coupled to a plurality of channels 208, as shown in the example in FIG. 2. This enables the plurality of channels 208 to be controlled by a single gate structure 212 and a pair of source/drain regions 210.

The semiconductor device 200 may also include an interlayer dielectric (ILD) layer 214 above the STI regions 206. The ILD layer 214 may be referred to as an ILD0 layer. The ILD layer 214 surrounds the gate structures 212 to provide electrical isolation and/or insulation between the gate structures 212 and/or the source/drain regions 210, among other examples. Conductive structures such as contacts and/or interconnects may be formed through the ILD layer 214 to the source/drain regions 210 and the gate structures 212 to provide control of the source/drain regions 210 and the gate structures 212.

In some implementations, the semiconductor device 200 includes a first fin structure (e.g., a first fin structure 204) over the semiconductor substrate 202, a second fin structure (e.g., a second fin structure 204) adjacent to the first fin structure and over the semiconductor substrate 202, and an STI region (e.g., the STI region 206) between the first fin structure and the second fin structure. The semiconductor device 200 may include a first cladding sidewall layer along a first sidewall, of the first fin structure, that is facing the second fin structure. The semiconductor device 200 may include a second cladding sidewall layer along a second sidewall, of the second fin structure, that is facing the first fin structure. In some implementations, a first bottom edge of the first cladding sidewall layer is lower relative to a second bottom edge of the second cladding sidewall layer. The different depths of the bottom edges of the first cladding sidewall layer and the second cladding sidewall layer provide sufficient electrical isolation for different types of fin structures (e.g., fin structures for p-type nanostructure transistors and fin structures for n-type nanostructure transistors) while reducing and/or minimizing footing of the first and second cladding sidewall layers on the STI region 206. The reduced and/or minimized footing may reduce a likelihood of electrical shorting in the semiconductor device 200.

Additionally, or alternatively, the semiconductor device 200 may include the fin structure 204 and a first cladding sidewall layer along a first sidewall of the fin structure 204. In some implementations, the first cladding sidewall layer includes a first bottom edge at a first vertical location. The semiconductor device 200 may include a second cladding sidewall layer along a second sidewall of the fin structure 204 opposing the first sidewall. In some implementations, the second cladding sidewall layer includes a second bottom edge at a second vertical location that is lower relative to the first vertical location of the first bottom edge. The different vertical locations of the bottom edges of the first cladding sidewall layer and the second cladding sidewall layer provide sufficient electrical isolation for different types of fin structures (e.g., fin structures for p-type nanostructure transistors and fin structures for n-type nanostructure transistors) while reducing and/or minimizing footing of the first and second cladding sidewall layers on the STI region 206. The reduced and/or minimized footing may reduce a likelihood of electrical shorting in the semiconductor device 200.

The semiconductor device 200 may include different combinations of regions and features. As an example, and as described in connection with FIGS. 3A-3U, 4A-4I, 5A-5D, 6, and elsewhere herein, the semiconductor device 200 may include a plurality of nanostructure channels over a substrate. In some implementations, a plurality of the nanostructure channels are arranged in a direction perpendicular to the substrate. The semiconductor device 200 may include a gate structure wrapping around the plurality of nanostructure channels over the substrate. The semiconductor device 200 may include a source/drain region adjacent to the plurality of nanostructure channels and adjacent to the plurality of portions of the gate structure. The semiconductor device 200 may include an inner spacer disposed between a top surface of a mesa region and a bottom nanostructure channel of the plurality of nanostructure channels. The semiconductor device 200 may further include a buffer region under the source/drain region. In some implementations, a curved top surface of the buffer region includes an apex height that is greater relative to a height of a bottom surface of the inner spacer layer. In some implementations, the apex height of the curved top surface is lesser relative to a height of a top surface of the inner spacer layer.

Additionally, or alternatively, the semiconductor device 200 may include a bottom nanostructure channel over a substrate The semiconductor device 200 may include a first hybrid fin structure adjacent to a first side of the bottom nanostructure channel and a second hybrid fin structure adjacent to a second side of the bottom nanostructure channel that is opposite the first side. The semiconductor device 200 may include a buffer region between the first hybrid fin structure and the second hybrid fin structure. In some implementations, a first portion of the buffer region extends into a first shallow trench isolation region between the first side of the bottom nanostructure channel and the first hybrid fin structure. In some implementations, a second portion of the buffer region extends into a second shallow trench isolation region that is between the second side of the bottom nanostructure channel and the second hybrid fin structure. In some implementations, a curved top surface of the buffer region includes an apex height that is greater relative to a height of a top surface of the first shallow trench isolation region, greater relative to a height of a top surface of the second shallow trench isolation region, and lesser relative to a height of a bottom surface of the bottom nanostructure channel.

As indicated above, FIG. 2 is provided as an example. Other examples may differ from what is described with regard to FIG. 2.

FIGS. 3A-3U are diagrams of an example implementation 300 described herein. Operations shown in the example implementation 300 may be performed in a different order than shown in FIGS. 3A-3U. The example implementation 300 includes an example of forming the semiconductor device 200 or a portion thereof (e.g., an example of forming nanostructure transistor(s) of the semiconductor device 200). The semiconductor device 200 may include one or more additional devices, structures, and/or layers not shown in FIGS. 3A-3U. The semiconductor device 200 may include additional layers and/or dies formed on layers above and/or below the portion of the semiconductor device 200 shown in FIGS. 3A-3U. Additionally, or alternatively, one or more additional semiconductor structures and/or semiconductor devices may be formed in a same layer of an electronic device that includes the semiconductor device 200.

FIGS. 3A and 3B respectively illustrate a perspective view of the semiconductor device 200 and a cross-sectional view along the line A-A in FIG. 3A. As shown in FIGS. 3A and 3B, processing of the semiconductor device 200 is performed in connection with the semiconductor substrate 202. A layer stack 302 is formed on the semiconductor substrate 202. The layer stack 302 may be referred to as a superlattice. In some implementations, one or more operations are performed in connection with the semiconductor substrate 202 prior to formation of the layer stack 302. For example, an anti-punch through (APT) implant operation may be performed. The APT implant operation may be performed in one or more regions of the semiconductor substrate 202 above which channels 208 are to be formed. The APT implant operation is performed, for example, to reduce and/or prevent punch-through or unwanted diffusion into the semiconductor substrate 202.

The layer stack 302 includes a plurality of alternating layers. The alternating layers include a plurality of first layers 304 and a plurality of second layers 306. The quantity of the first layers 304 and the quantity of the second layers 306 illustrated in FIGS. 3A and 3B are examples, and other quantities of the first layers 304 and the second layers 306 are within the scope of the present disclosure. In some implementations, the first layers 304 and the second layers 306 are formed to different thicknesses. For example, the second layers 306 may be formed to a thickness that is greater relative to a thickness of the first layers 304. In some implementations, the first layers 304 (or a subset thereof) are formed to a thickness in a range of approximately 4 nanometers to approximately 7 nanometers. In some implementations, the second layers 306 (or a subset thereof) are formed to a thickness in a range of approximately 8 nanometers to approximately 12 nanometers. However, other values for the thickness of the first layers 304 and for the thickness of the second layers 306 are within the scope of the present disclosure.

The first layers 304 include a first material composition, and the second layers 306 include a second material composition. In some implementations, the first material composition and the second material composition are the same material composition. In some implementations, the first material composition and the second material composition are different material compositions. As an example, the first layers 304 may include silicon germanium (SiGe) and the second layers 306 may include silicon (Si). In some implementations, the first material composition and the second material composition have different oxidation rates and/or etch selectivity.

As described herein, the first layers 304 are eventually removed and serve to define a vertical distance between adjacent channels 208 for subsequently-formed nanostructure transistors of the semiconductor device 200. Accordingly, the first layers 304 may also be referred to as sacrificial layers, and the second layers 306 may be referred to as channel layers or as nanostructure channels.

The deposition tool 102 deposits and/or grows the alternating layers to include nanostructures (e.g., nanosheets) on the semiconductor substrate 202. For example, the deposition tool 102 grows the alternating layers by epitaxial growth. However, other processes may be used to form the alternating layers of the layer stack 302. Epitaxial growth of the alternating layers of the layer stack 302 may be performed by a molecular beam epitaxy (MBE) process, a metalorganic chemical vapor deposition (MOCVD) process, and/or another suitable epitaxial growth process. In some implementations, the epitaxially grown layers such as the second layers 306 include the same material as the material of the semiconductor substrate 202. In some implementations, the first layers 304 and/or the second layers 306 include a material that is different from the material of the semiconductor substrate 202. As described above, in some implementations, the first layers 304 include epitaxially grown silicon germanium (SiGe) layers and the second layers 306 include epitaxially grown silicon (Si) layers. Alternatively, the first layers 304 and/or the second layers 306 may include other materials such as germanium (Ge), a compound semiconductor material such as silicon carbide (SiC), gallium arsenide (GaAs), gallium phosphide (GaP), indium phosphide (InP), indium arsenide (IAs), indium antimonide (InSb), an alloy semiconductor such as silicon germanium (SiGe), gallium arsenide phosphide (GaAsP), aluminum indium arsenide (AlInAs), aluminum gallium arsenide (AlGaAs), indium gallium arsenide (InGaAs), gallium indium phosphide (GaInP), gallium indium arsenide phosphide (GaInAsP), and/or a combination thereof. The material(s) of the first layers 304 and/or the material(s) of the second layers 306 may be chosen based on providing different oxidation properties, different etching selectivity properties, and/or other different properties.

As further shown in FIGS. 3A and 3B, the deposition tool 102 may form one or more additional layers over and/or on the layer stack 302. For example, a hard mask (HM) layer 308 may be formed over and/or on the layer stack 302 (e.g., on the top-most second layer 306 of the layer stack 302). As another example, a capping layer 310 may be formed over and/or on the hard mask layer 308. As another example, another hard mask layer including an oxide layer 312 and a nitride layer 314 may be formed over and/or on the capping layer 310. The one or more hard mask (HM) layers 308, 312, and 314 may be used to form one or more structures of the semiconductor device 200. The oxide layer 312 may function as an adhesion layer between the layer stack 302 and the nitride layer 314, and may act as an etch stop layer for etching the nitride layer 314. The one or more hard mask layers 308, 312, and 314 may include silicon germanium (SiGe), a silicon nitride ($Si_xN_y$), a silicon oxide ($SiO_x$), and/or another material. The capping layer 310 may include silicon (Si) and/or another material. In some implementations, the capping layer 310 is formed of the same material as the semiconductor substrate 202. In some implementations, the one or more additional layers are thermally grown, deposited by CVD, PVD, ALD, and/or are formed using another deposition technique.

Figures 3C, 3D:
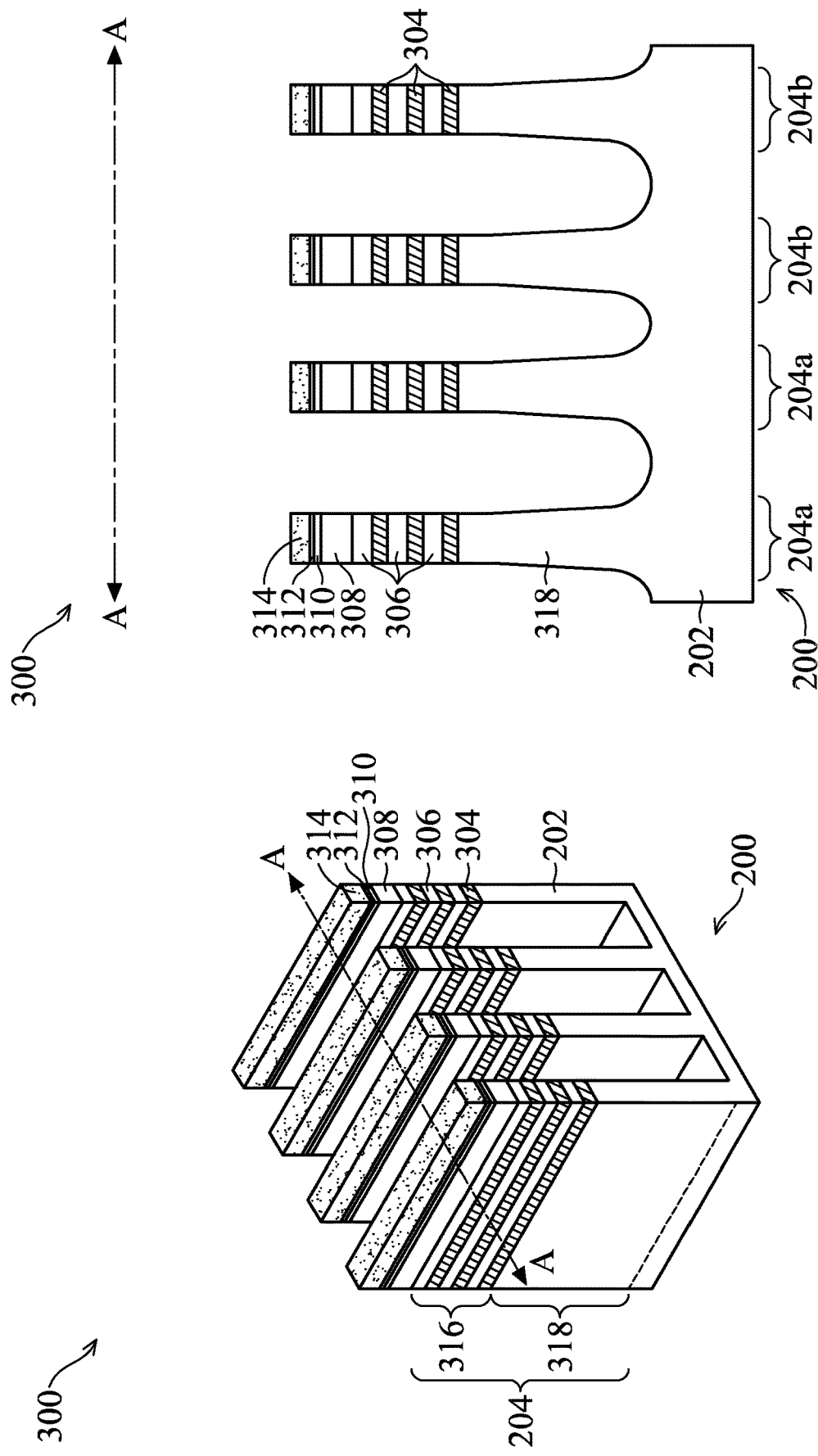

FIGS. 3C and 3D respectively illustrate a perspective view of the semiconductor device 200 and a cross-sectional view along the line A-A in FIG. 3C. As shown in FIGS. 3C and 3D, fin structures 204 are formed above the semiconductor substrate 202 of the semiconductor device 200. A fin structure 204 includes a portion 316 of the layer stack 302 over and/or on a portion 318 (e.g., a mesa region of the fin structure 204) formed in and/or above the semiconductor substrate 202. The fin structures 204 may be formed by any suitable semiconductor processing technique. For example, the fin structures 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin structures.

The fin structures 204 may subsequently be fabricated using suitable processes including photolithography and etch processes. In some implementations, the deposition tool 102 forms a photoresist layer over and/or on the hard mask layer including the oxide layer 312 and the nitride layer 314, the exposure tool 104 exposes the photoresist layer to radiation (e.g., deep ultraviolet (UV) radiation, extreme UV (EUV) radiation), a post-exposure bake process is performed (e.g., to remove residual solvents from the photoresist layer), and the developer tool 106 develops the photoresist layer to form a masking element (or pattern) in the photoresist layer. In some implementations, patterning the photoresist layer to form the masking element is performed using an electron beam (e-beam) lithography process. The masking element may then be used to protect portions of the semiconductor substrate 202 and portions the layer stack 302 in an etch operation such that the portions of the semiconductor substrate 202 and portions the layer stack 302 remain non-etched to form the fin structures 204. Unprotected portions of the substrate and unprotected portions of the layer stack 302 are etched (e.g., by the etch tool 108) to form trenches in the semiconductor substrate 202. The etch tool may etch the unprotected portions of the substrate and unprotected portions of the layer stack 302 using a dry etch technique (e.g., reactive ion etching), a wet etch technique, and/or a combination thereof.

In some implementations, another fin formation technique is used to form the fin structures 204. For example, a fin region may be defined (e.g., by mask or isolation regions), and the portions 316 may be epitaxially grown in the form of the fin structure 204. In some implementations, forming the fin structures 204 includes a trim process to decrease the width of the fin structures 204. The trim process may include wet and/or dry etching processes, among other examples.

As further shown in FIG. 3D, fin structures 204 may be formed for different types of nanostructure transistors for the semiconductor device 200. In particular, a first subset of fin structures 204a may be formed for p-type nanostructure transistors (e.g., p-type metal oxide semiconductor (PMOS) nanostructure transistors), and a second subset of fin structures 204b may be formed for n-type nanostructure transistors (e.g., n-type metal oxide semiconductor (NMOS) nanostructure transistors). Bottoms of the first subset of fin structures 204a may be doped with an n-type dopant (e.g., phosphorous (P) and/or arsenic (As), among other examples) that is opposite of a dopant of the p-type nanostructure transistor. Bottoms of the second subset of fin structures 204b may be doped with p-type dopant (e.g., boron (B) and/or germanium (Ge), among other examples) that is opposite a dopant of the n-type nanostructure transistor. Additionally or alternatively, p-type source/drain regions 210 may be subsequently formed for the p-type nanostructure transistors that include the first subset of fin structures 204a, and n-type source/drain regions 210 may be subsequently formed for the n-type nanostructure transistors that include the second subset of fin structures 204b.

The first subset of fin structures 204a (e.g., PMOS fin structures) and the second subset of fin structures 204b (e.g., NMOS fin structures) may be formed to include similar properties and/or different properties. For example, the first subset of fin structures 204a may be formed to a first height and the second subset of fin structures 204b may be formed to a second height, where the first height and the second height are different heights. As another example, the first subset of fin structures 204a may be formed to a first width and the second subset of fin structures 204b may be formed to a second width, where the first width and the second width are different widths. In the example shown in FIG. 3D, the second width of the second subset of fin structures 204b (e.g., for the NMOS nanostructure transistors) is greater relative to the first width of the first subset of fin structures 204b (e.g., for the PMOS nanostructure transistors). However, other examples are within the scope of the present disclosure.

Figures 3E, 3F:
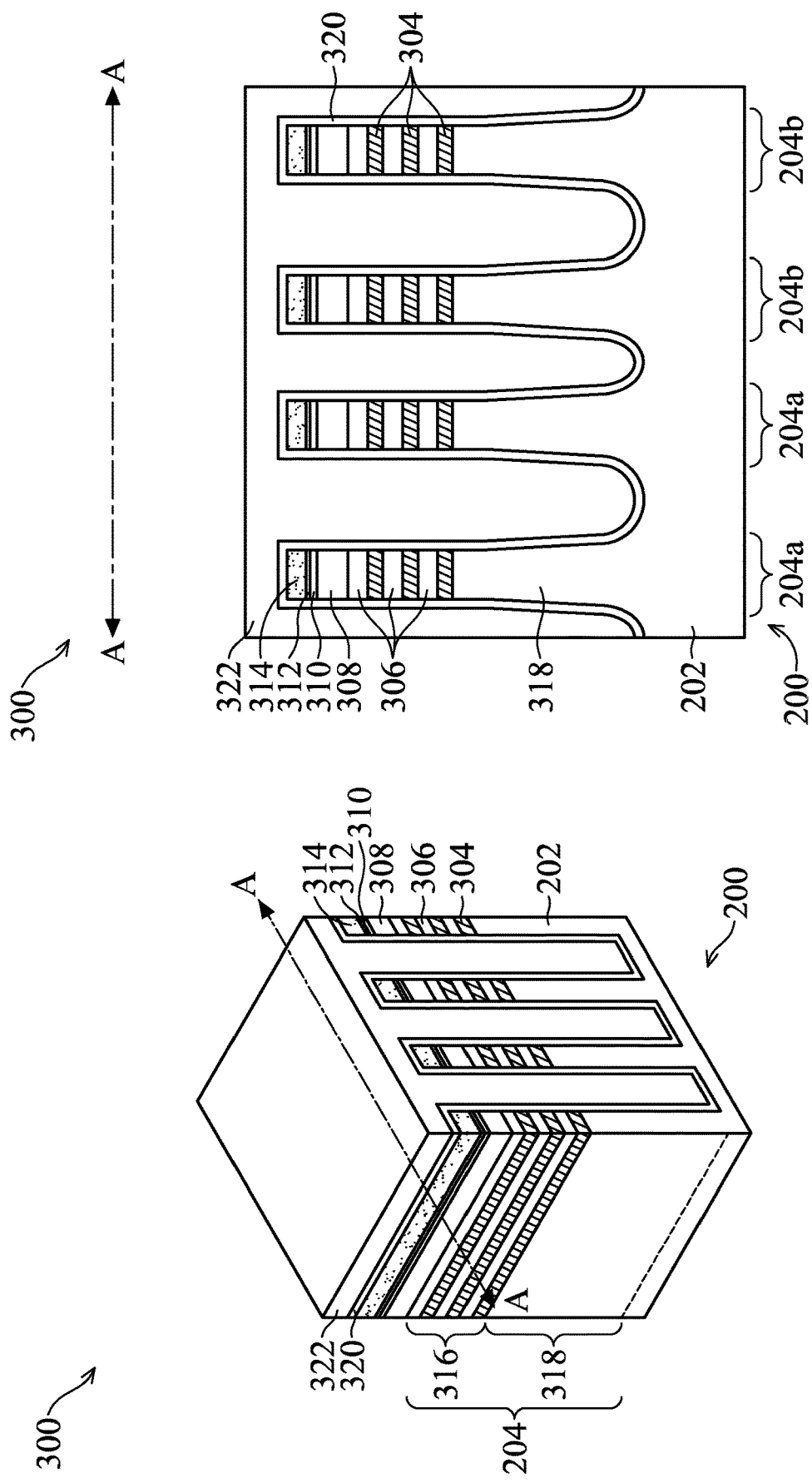

FIGS. 3E and 3F respectively illustrate a perspective view of the semiconductor device 200 and a cross-sectional view along the line A-A in FIG. 3E. As shown in FIGS. 3E and 3F, a liner 320 and a dielectric layer 322 are formed above the semiconductor substrate 202 and interposing (e.g., in between) the fin structures 204. The deposition tool 102 may deposit the liner 320 and the dielectric layer 322 over the semiconductor substrate 202 and in the trenches between the fin structures 204. The deposition tool 102 may form the dielectric layer 322 such that a height of a top surface of the dielectric layer 322 and a height of a top surface of the nitride layer 314 are approximately a same height.

Alternatively, the deposition tool 102 may form the dielectric layer 322 such that the height of the top surface of the dielectric layer 322 is greater relative to the height of the top surface of the nitride layer 314, as shown in FIGS. 3E and 3F. In this way, the trenches between the fin structures 204 are overfilled with the dielectric layer 322 to ensure the trenches are fully filled with the dielectric layer 322. Subsequently, the planarization tool 110 may perform a planarization or polishing operation (e.g., a CMP operation) to planarize the dielectric layer 322. The nitride layer 314 of the hard mask layer may function as a CMP stop layer in the operation. In other words, the planarization tool 110 planarizes the dielectric layer 322 until reaching the nitride layer 314 of the hard mask layer. Accordingly, a height of top surfaces of the dielectric layer 322 and a height of top surfaces of the nitride layer 314 are approximately equal after the operation.

The deposition tool 102 may deposit the liner 320 using a conformal deposition technique. The deposition tool 102 may deposit the dielectric layer using a CVD technique (e.g., a flowable CVD (FCVD) technique or another CVD technique), a PVD technique, an ALD technique, and/or another deposition technique. In some implementations, after deposition of the dielectric layer 322, the semiconductor device 200 is annealed, for example, to increase the quality of the dielectric layer 322.

The liner 320 and the dielectric layer 322 each includes a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. In some implementations, the dielectric layer 322 may include a multi-layer structure, for example, having one or more liner layers.

Figures 3G, 3H:
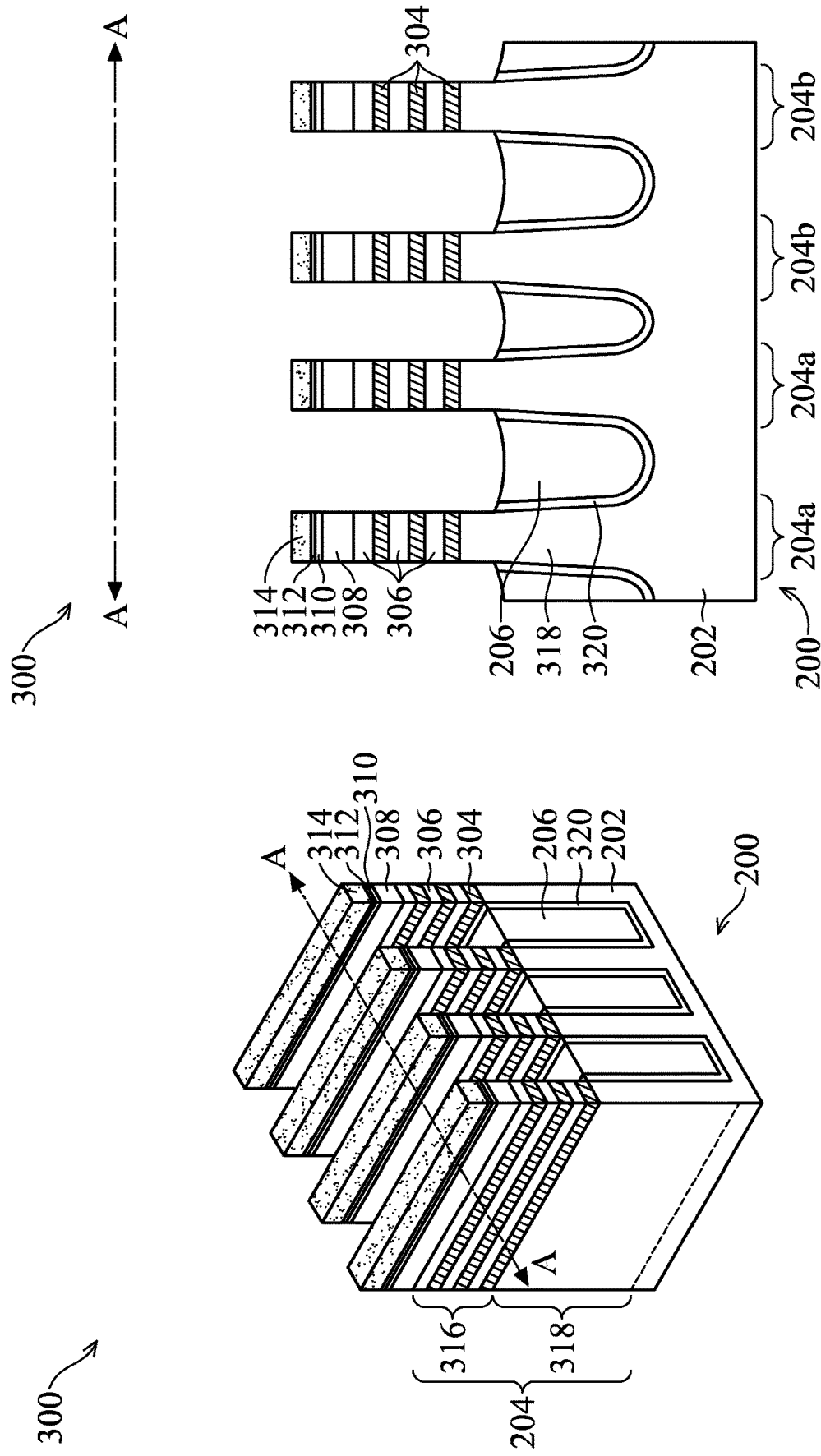

FIGS. 3G and 3H respectively illustrate a perspective view of the semiconductor device 200 and a cross-sectional view along the line A-A in FIG. 3G. As shown in FIGS. 3G and 3H, an etch back operation is performed to remove portions of the liner 320 and portions of the dielectric layer 322 to form the STI regions 206. The etch tool 108 may etch the liner 320 and the dielectric layer 322 in the etch back operation to form the STI regions 206. The etch tool 108 etches the liner 320 and the dielectric layer 322 based on the hard mask layer (e.g., the hard mask layer including the oxide layer 312 and the nitride layer 314). The etch tool 108 etches the liner 320 and the dielectric layer 322 such that the height of the STI regions 206 are less than or approximately a same height as the bottom of the portions 316 of the layer stack 302. Accordingly, the portions 316 of the layer stack 302 extend above the STI regions 206. In some implementations, the liner 320 and the dielectric layer 322 are etched such that the heights of the STI regions 206 are less than heights of top surfaces of the portions 318.

In some implementations, the etch tool 108 uses a plasma-based dry etch technique to etch the liner 320 and the dielectric layer 322. Ammonia ($NH_3$), hydrofluoric acid (HF), and/or another etchant may be used. The plasma-based dry etch technique may result in a reaction between the etchant(s) and the material of the liner 320 and the dielectric layer 322, including:

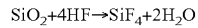

where silicon dioxide ($SiO_2$) of the liner 320 and the dielectric layer 322 react with hydrofluoric acid to form byproducts including silicon tetrafluoride ($SiF_4$) and water ($H_2O$). The silicon tetrafluoride is further broken down by the hydrofluoric acid and ammonia to form an ammonium fluorosilicate (($NH_4)_2SiF_6$) byproduct:

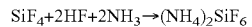

The ammonium fluorosilicate byproduct is removed from a processing chamber of the etch tool 108. After removal of the ammonium fluorosilicate, a post-process temperature in a range of approximately 200 degrees Celsius to approximately 250 degrees Celsius is used to sublimate the ammonium fluorosilicate into constituents of silicon tetrafluoride, ammonia, and hydrofluoric acid.

As further shown in FIG. 3H, the etch tool 108 may etch the liner 320 and the dielectric layer 322 such that a height of the STI regions 206 between the first subset of fin structures 204a (e.g., for the PMOS nanostructure transistors) is greater relative to a height of the STI regions 206 between the second subset of fin structures 204b (e.g., for the NMOS nanostructure transistors). This primarily occurs due to the greater width the fin structures 204b relative to the width of the fin structures 204a. Moreover, this results in a top surface of an STI region 206 between a fin structure 204a and a fin structure 204b being sloped or slanted (e.g., downward sloped from the fin structure 204a to the fin structure 204b, as shown in the example in FIG. 3H). The etchants used to etch the liner 320 and the dielectric layer 322 first experience physisorption (e.g., a physical bonding to the liner 320 and the dielectric layer 322) as a result of a Van der Waals force between the etchants and the surfaces of the liner 320 and the dielectric layer 322. The etchants become trapped by dipole movement force. The etchants then attach to dangling bonds of the liner 320 and the dielectric layer 322, and chemisorption begins. Here, the chemisorption of the etchant on the surface of the liner 320 and the dielectric layer 322 results in etching of the liner 320 and the dielectric layer 322. The greater width of the trenches between the second subset of fin structures 204b provides a greater surface area for chemisorption to occur, which results in a greater etch rate between the second subset of fin structures 204b. The greater etch rate results in the height of the STI regions 206 between the second subset of fin structures 204b being lesser relative to the height of the STI regions 206 between the first subset of fin structures 204a.

Figures 3I, 3J:
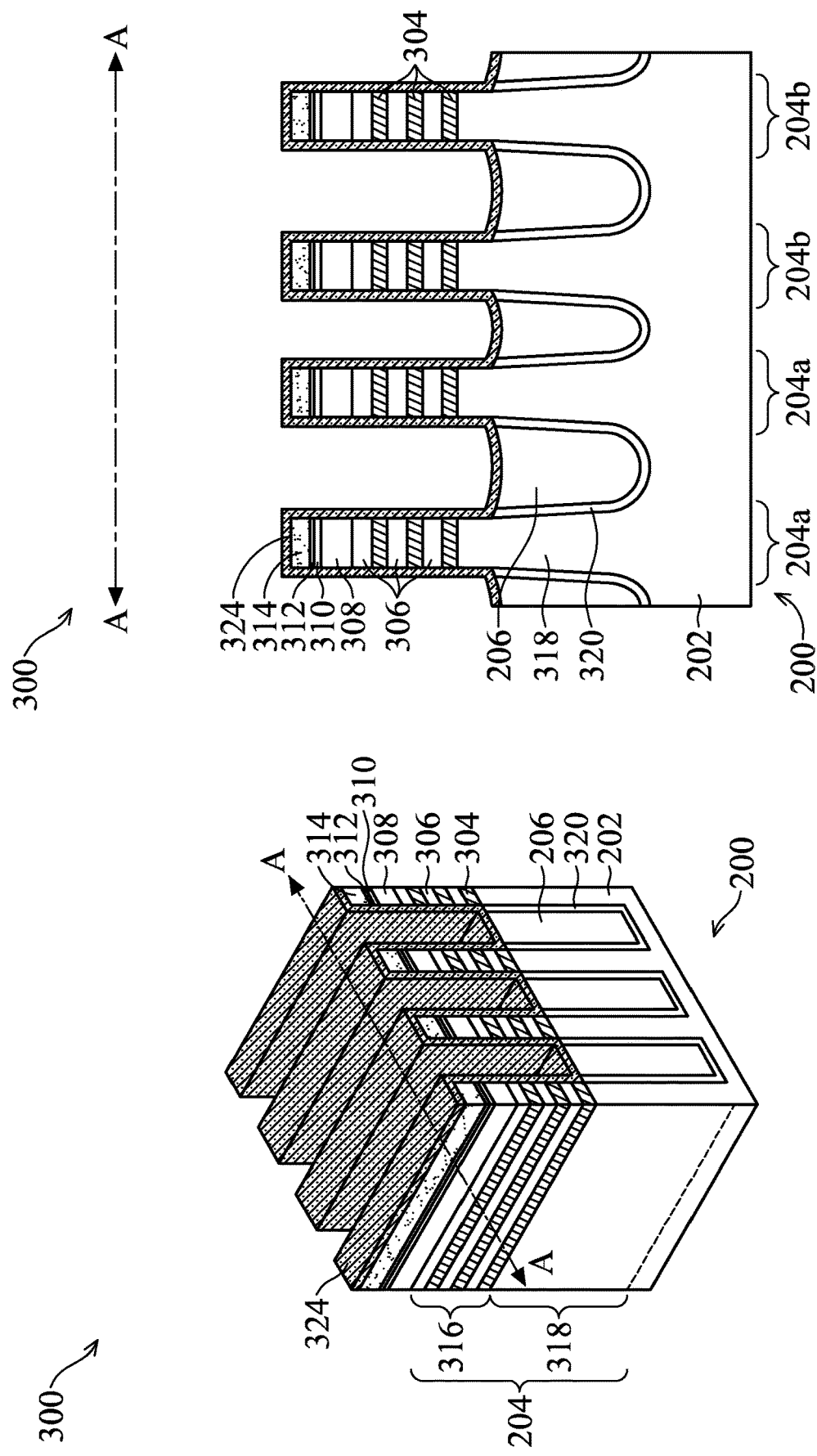

FIGS. 3I and 3J respectively illustrate a perspective view of the semiconductor device 200 and a cross-sectional view along the line A-A in FIG. 3I. As shown in FIGS. 3I and 3J, a cladding layer 324 is formed over the fin structures 204 (e.g., over the top surfaces and over the sidewalls of the fin structures 204) and over the STI regions 206 between the fin structures 204. The cladding layer 324 includes silicon germanium (SiGe) or another material. The deposition tool 102 may deposit the cladding layer 324. In some implementations, the deposition tool 102 deposits a seed layer (e.g., a silicon (Si) seed layer or another type of seed layer) over the fin structures 204 (e.g., over the top surfaces and over the sidewalls of the fin structures 204) and over the STI regions 206 between the fin structures 204. Then, the deposition tool 102 deposits silicon germanium on the seed layer to form the cladding layer 324. The seed layer promotes growth and adhesion of the cladding layer 324.

Deposition of the seed layer may include providing a silicon precursor to a processing chamber of the deposition tool 102 using a carrier gas such as nitrogen ($N_2$) or hydrogen ($H_2$), among other examples. In some implementations, a pre-clean operation is performed prior to deposition of the seed layer to reduce the formation of germanium oxide ($GeO_x$). The silicon precursor may include disilane ($Si_2H_6$) or another silicon precursor. The use of disilane may enable formation of a seed layer to a thickness that is in a range of approximately 0.5 nanometers to approximately 1.5 nanometers.

Deposition of the seed layer may be performed at a temperature in a range of approximately 450 degrees Celsius to approximately 500 degrees Celsius (or at a temperature in another range), at a pressure in a range of approximately 30 torr to approximately 100 torr (or at a pressure in another range), and/or for a time duration in a range of approximately 100 seconds to approximately 300 seconds (or for a time duration in another range), among other examples.

Deposition of the silicon germanium of the cladding layer 324 may include forming the cladding layer 324 to include an amorphous texture to promote conformal deposition of the cladding layer 324. The silicon germanium may include a germanium content in a range of approximately 15% germanium to approximately 25% germanium. However, other values for the germanium content are within the scope of the present disclosure. Deposition of the cladding layer 324 may include providing a silicon precursor (e.g., disilane ($Si_2H_6$) or silicon tetrahydride ($SiH_4$), among other examples) and a germanium precursor (e.g., germanium tetrahydride ($GeH_4$) or another germanium precursor) to a processing chamber of the deposition tool 102 using a carrier gas such as nitrogen ($N_2$) or hydrogen ($H_2$), among other examples. Deposition of the cladding layer 324 may be performed at a temperature in a range of approximately 500 degrees Celsius to approximately 550 degrees Celsius (or at a temperature in another range) and/or at a pressure in a range of approximately 5 torr to approximately 20 torr (or at a pressure in another range).

Figure 3L:
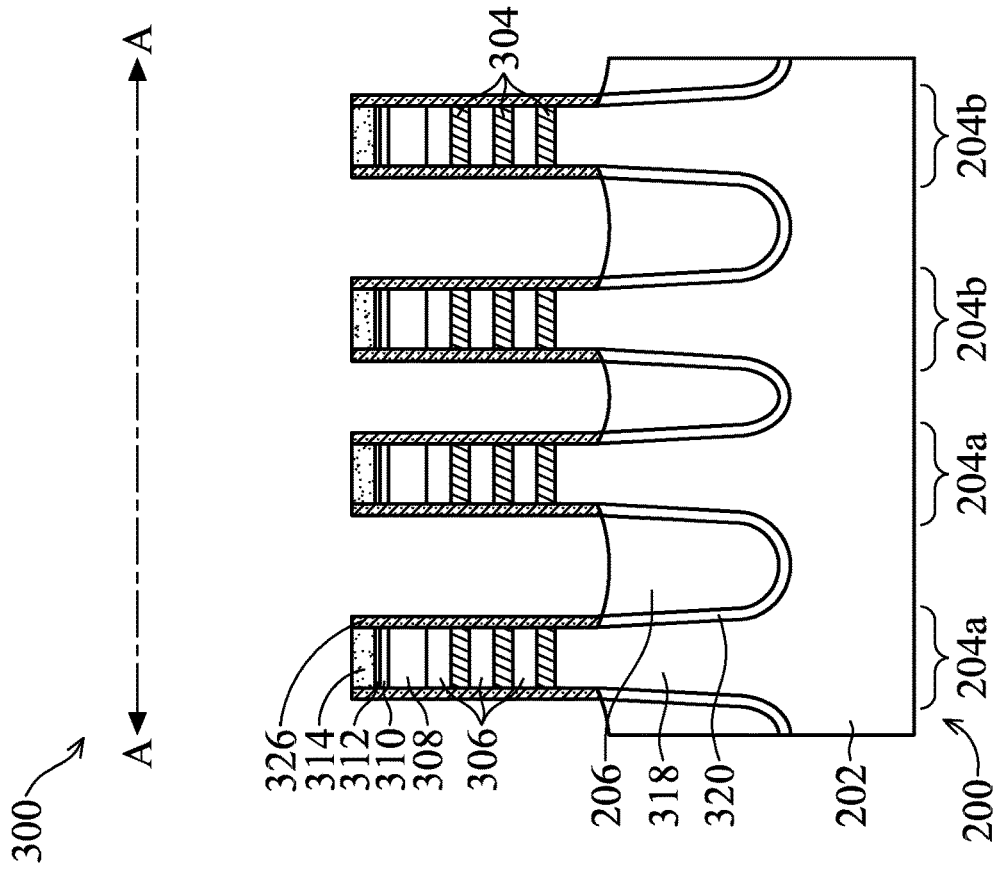
Figure 3K:
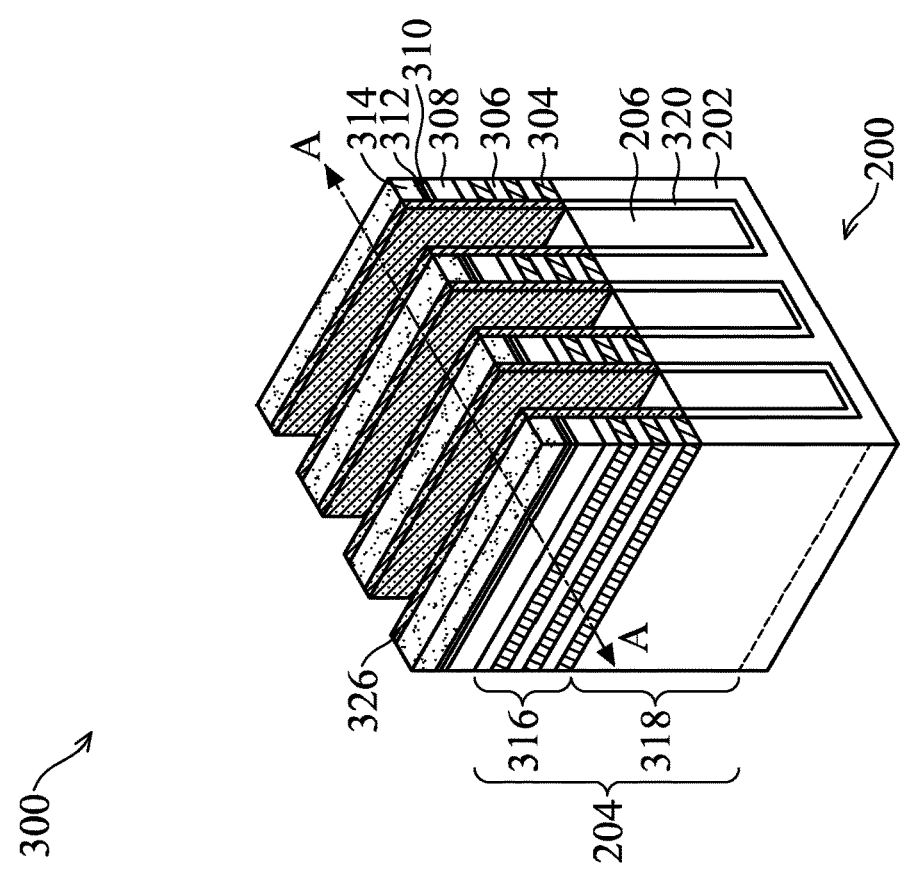

FIGS. 3K and 3L respectively illustrate a perspective view of the semiconductor device 200 and a cross-sectional view along the line A-A in FIG. 3K. As shown in FIGS. 3K and 3L, an etch back operation is performed to etch the cladding layer 324 to form cladding sidewall layers 326. The etch tool 108 may etch the cladding layer 324 using a plasma-based dry etch technique or another etch technique. The etch tool 108 may perform the etch back operation to remove portions of the cladding layer 324 from the tops of the fin structures 204 and from the tops of the STI regions 206.

In some implementations, the etch tool 108 uses a fluorine-based etchant to etch the cladding layer 324. The fluorine-based etchant may include sulfur hexafluoride ($SF_6$), fluoromethane ($CH_3F_3$), and/or another fluorine-based etchant. Other reactants and/or carriers such as methane ($CH_4$), hydrogen ($H_2$), argon (Ar), and/or helium (He) may be used in the etch back operation. In some implementations, the etch back operation is performed using a plasma bias in a range of approximately 500 volts to approximately 2000 volts. However, other values for the plasma bias are within the scope of the present disclosure.

In some implementations, removing portions of the cladding layer 324 from the tops of the STI regions 206 includes removing (e.g., selectively etching) one or more footings. In some implementations, the one or more footings are formed over of the STI regions 206 from the cladding layer 324 due to a quality of the liner 320 within the STI regions 206. In some implementations, the one or more footings are formed over the STI regions 206 during conformal deposition of the cladding layer 324.

Figures 3M, 3N:
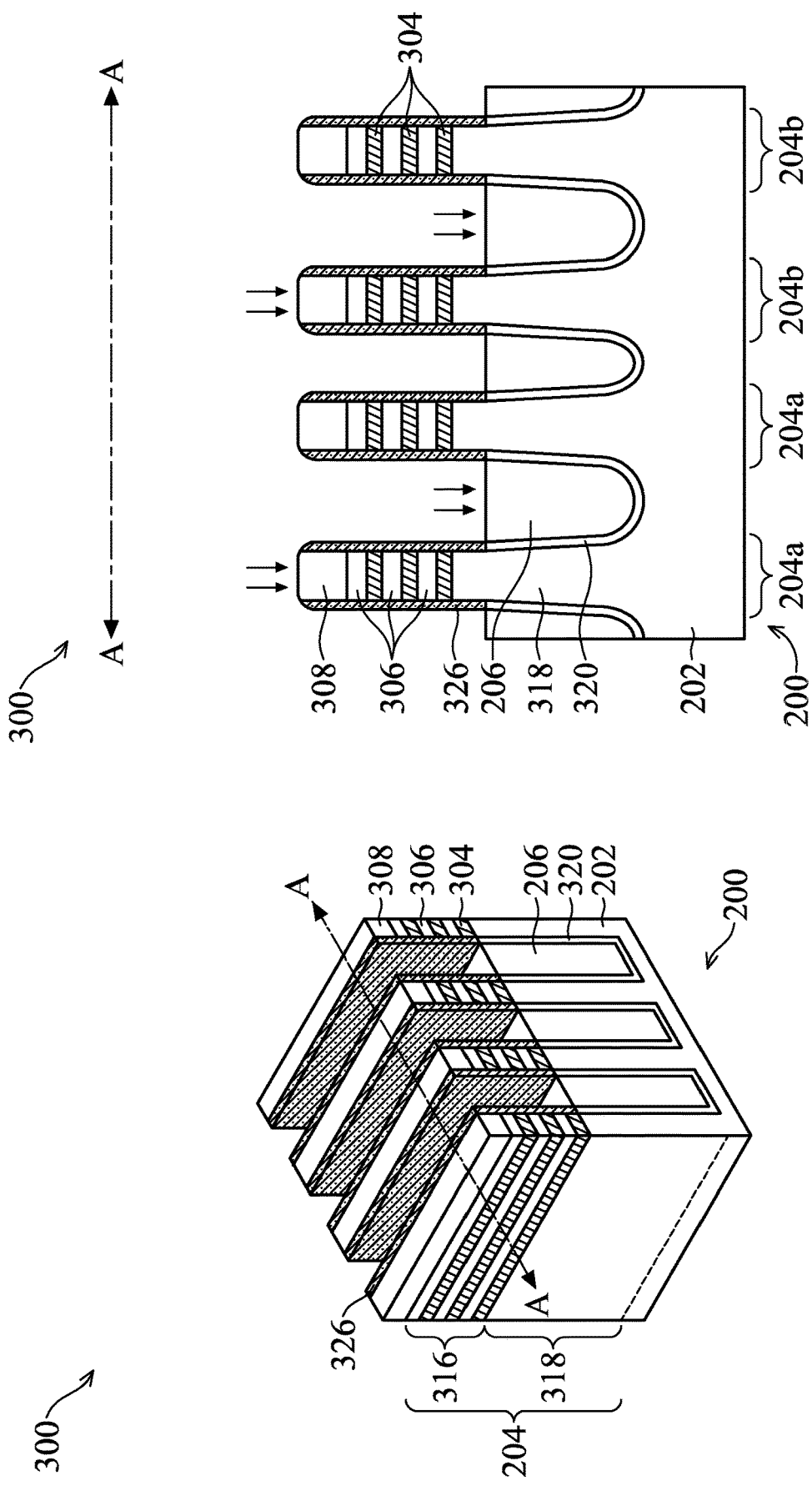

FIGS. 3M and 3N respectively illustrate a perspective view of the semiconductor device 200 and a cross-sectional view along the line A-A in FIG. 3M. As shown in FIGS. 3M and 3N, the hard mask layer (including the oxide layer 312 and the nitride layer 314) and the capping layer 310 are removed to expose the hard mask layer 308. In some implementations, the capping layer 310, the oxide layer 312, and the nitride layer 314 are removed using an etch operation (e.g., performed by the etch tool 108), a planarization technique (e.g., performed by the planarization tool 110), and/or another semiconductor processing technique.

FIGS. 3O and 3P respectively illustrate a perspective view of the semiconductor device 200 and a cross-sectional view along the line A-A in FIG. 3O. As shown in FIGS. 3O and 3P, a liner 328 and a dielectric layer 330 are formed above the semiconductor substrate 202 and interposing (e.g., in between) the fin structures 204. The deposition tool 102 may deposit the liner 328 and the dielectric layer 330 over the semiconductor substrate 202 and between the cladding sidewall layers 326 in the trenches between the fin structures 204. The deposition tool 102 may form the dielectric layer 330 such that a height of a top surface of the dielectric layer 330 and a height of a top surface of the hard mask layer 308 are approximately a same height.

Alternatively, the deposition tool 102 may form the dielectric layer 330 such that the height of the top surface of the dielectric layer 330 is greater relative to the height of the top surface of the hard mask layer 308, as shown in FIGS. 3O and 3P. In this way, the trenches between the fin structures 204 are overfilled with the dielectric layer 330 to ensure the trenches are fully filled with the dielectric layer 330. Subsequently, the planarization tool 110 may perform a planarization or polishing operation (e.g., a CMP operation) to planarize the dielectric layer 330.

The deposition tool 102 may deposit the liner 328 using a conformal deposition technique. The deposition tool 102 may deposit the dielectric layer 330 using a CVD technique (e.g., a flowable CVD (FCVD) technique or another CVD technique), a PVD technique, an ALD technique, and/or another deposition technique. In some implementations, after deposition of the dielectric layer 330, the semiconductor device 200 is annealed, for example, to increase the quality of the dielectric layer 330.

The liner 328 and the dielectric layer 330 each includes a dielectric material such as a silicon oxide ($SiO_x$), a silicon nitride ($Si_xN_y$), a silicon oxynitride (SiON), a silicon carbon nitride (SiCN), fluoride-doped silicate glass (FSG), a low-k dielectric material, and/or another suitable insulating material. In some implementations, the dielectric layer 330 may include a multi-layer structure, for example, having one or more liner layers.

Figures 3Q, 3R:
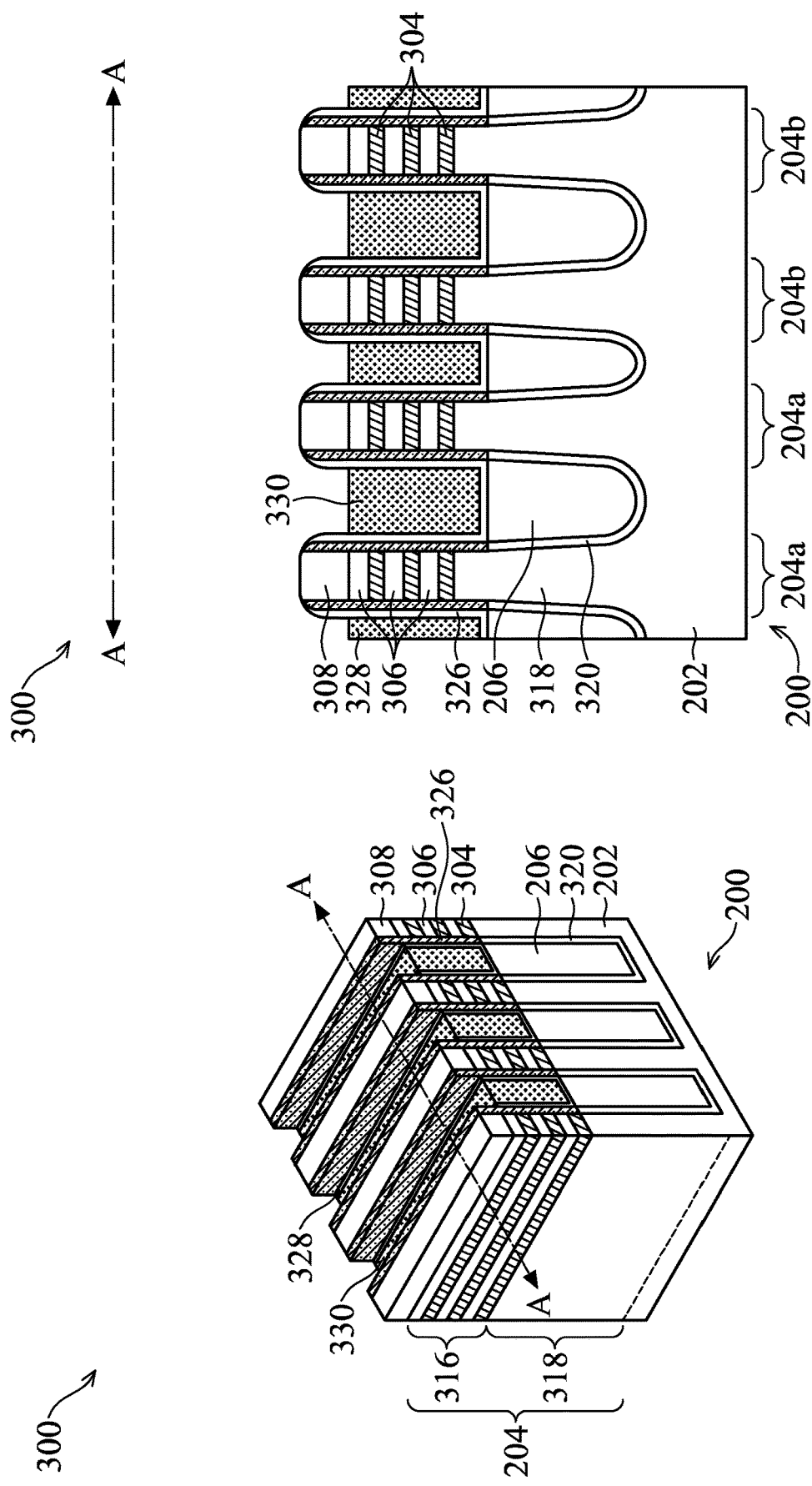

FIGS. 3Q and 3R respectively illustrate a perspective view of the semiconductor device 200 and a cross-sectional view along the line A-A in FIG. 3Q. As shown in FIGS. 3Q and 3R, an etch back operation is performed to remove portions of the dielectric layer 330. The etch tool 108 may etch the dielectric layer 330 in the etch back operation to reduce a height of a top surface of the dielectric layer 330. In particular, the etch tool 108 etches the dielectric layer 330 such that the height of portions of the dielectric layer 330 between the fin structures 204 is less than the height of the top surface of the hard mask layer 308. In some implementations, the etch tool 108 etches the dielectric layer 330 such that the height of portions of the dielectric layer 330 between the fin structures 204 is approximately equal to a height of top surfaces of the top-most of the second layers 306 of the portions 316.

Figures 3S, 3T:
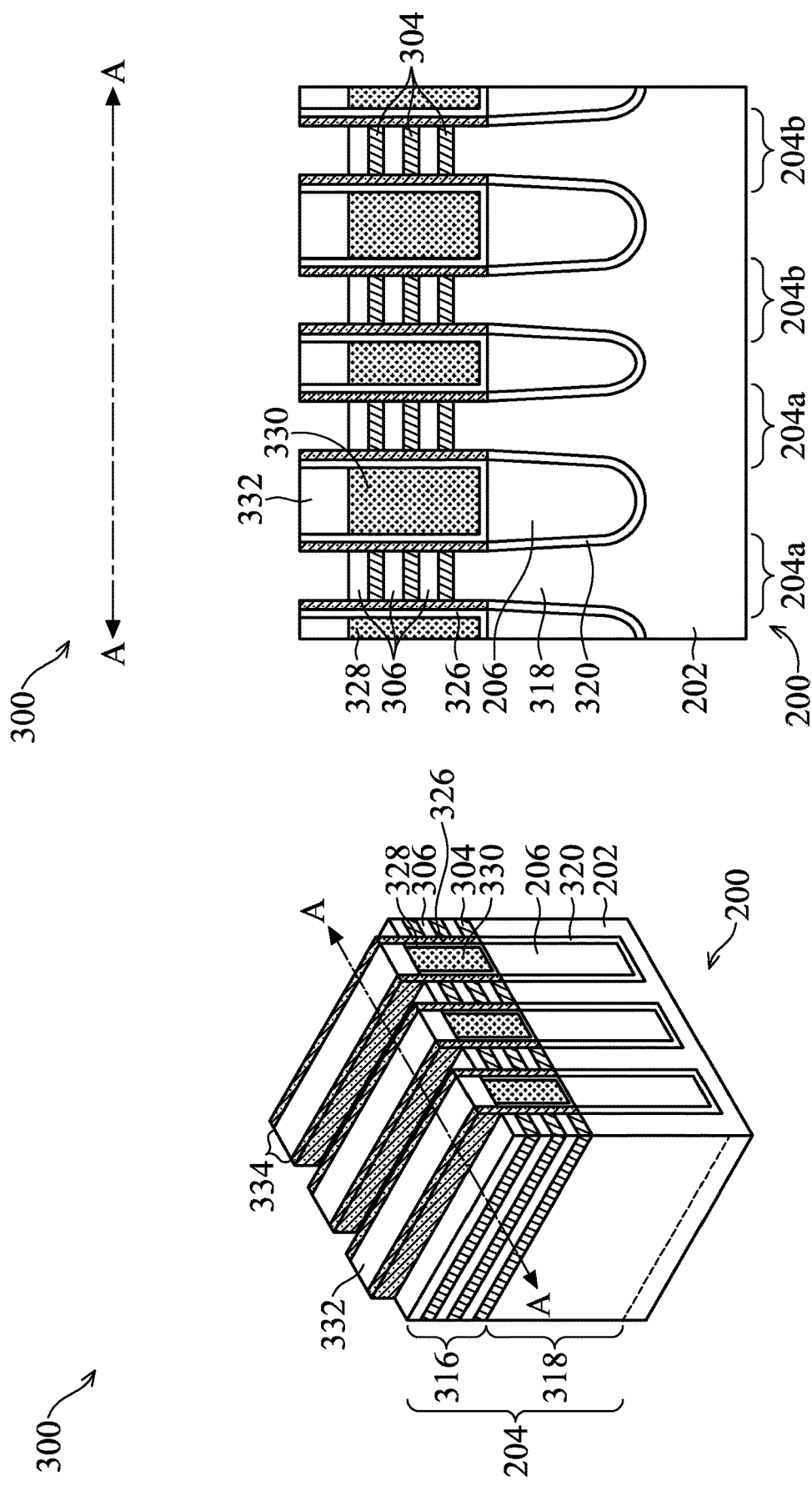
Figure 3U:
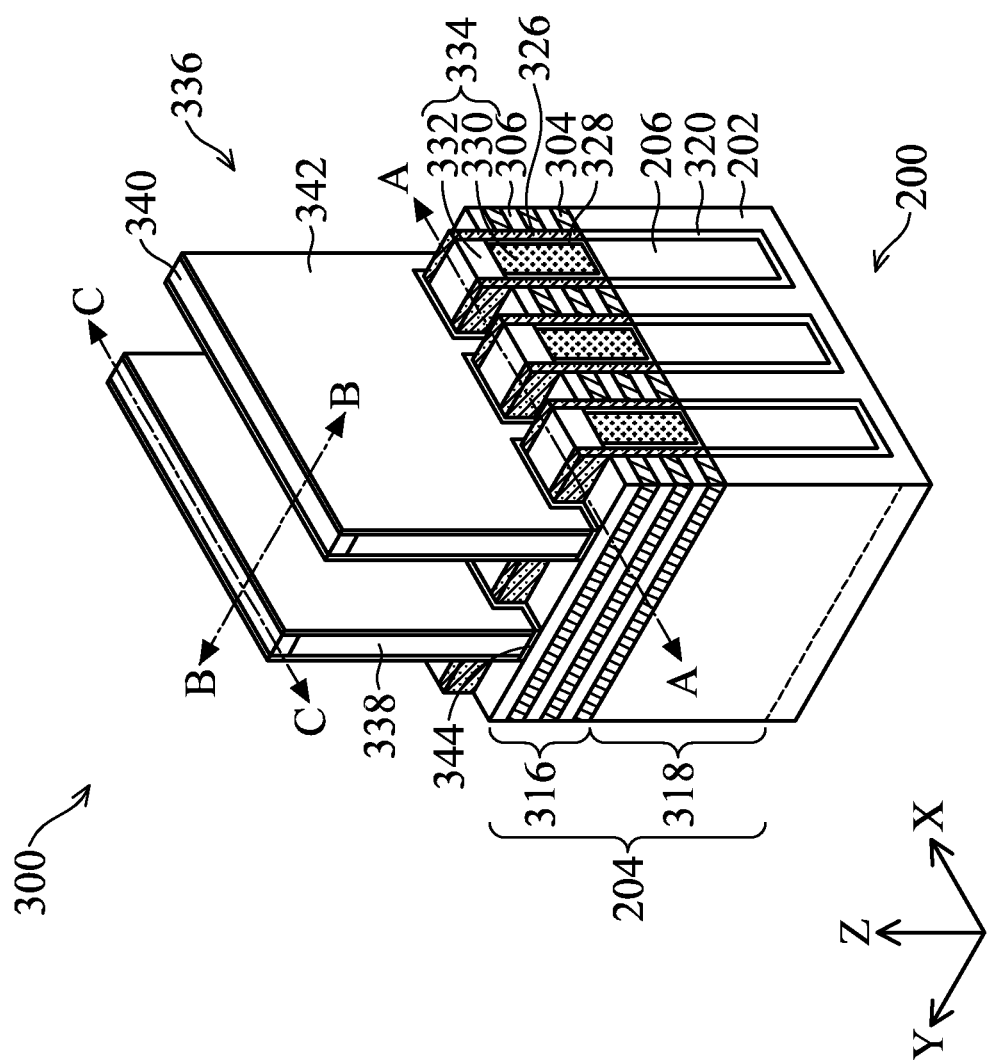

FIGS. 3S and 3T respectively illustrate a perspective view of the semiconductor device 200 and a cross-sectional view along the line A-A in FIG. 3S. As shown in FIGS. 3S and 3T, a high dielectric constant (high-k) layer 332 is deposited over the portions of the dielectric layer 330 between the fin structures 204. The deposition tool 102 may deposit a high-k material such as a hafnium oxide ($HfO_x$) and/or another high-k dielectric material to form the high-k layer 332 using a CVD technique, a PVD technique, an ALD technique, and/or another deposition technique. The combination of the portions of the dielectric layer 330 between the fin structures 204 and the high-k layer 332 between the fin structures 204 is referred to as a hybrid fin structure 334 (or dummy fin structure). In some implementations, the planarization tool 110 may perform a planarization operation to planarize the high-k layer 332 such that a height of a top surface of the high-k layer 332 and the height of the hard mask layer 308 are approximately equal.

Subsequently, and as shown in FIGS. 3S and 3T, the hard mask layer 308 is removed. Removal of the hard mask layer 308 may include using an etch technique (e.g., a plasma etch technique, a wet chemical etch technique, and/or another type of etch technique) or another removal technique.

FIG. 3U illustrates a perspective view of the semiconductor device 200. As shown in FIG. 3U, dummy gate structures 336 (also referred to as dummy gate stacks) are formed over the fin structures 204 and over the hybrid fin structures 334. The dummy gate structures 336 are sacrificial structures that are to be replaced by replacement gate structures (or replacement gate stacks) at a subsequent processing stage for the semiconductor device 200. Portions of the fin structures 204 underlying the dummy gate structures 336 may be referred to as channel regions. The dummy gate structures 336 may also define source/drain (S/D) regions of the fin structures 204, such as the regions of the fin structures 204 adjacent and on opposing sides of the channel regions.

A dummy gate structure 336 may include a gate electrode layer 338, a hard mask layer 340 over and/or on the gate electrode layer 338, and spacer layers 342 on opposing sides of the gate electrode layer 338 and on opposing sides of the hard mask layer 340. The dummy gate structures 336 may be formed on a gate dielectric layer 344 between the fin structures 204 and the dummy gate structures 336, and between the hybrid fin structures 334 and the dummy gate structures 336. The gate electrode layer 338 includes polycrystalline silicon (polysilicon or PO) or another material. The hard mask layer 340 includes one or more layers such as an oxide layer (e.g., a pad oxide layer that may include silicon dioxide ($SiO_2$) or another material) and a nitride layer (e.g., a pad nitride layer that may include a silicon nitride such as $Si_3N_4$ or another material) formed over the oxide layer. The spacer layers 342 include a silicon oxycarbide (SiOC), a nitrogen free SiOC, or another suitable material. The gate dielectric layer 344 may include a silicon oxide (e.g., $SiO_x$ such as $SiO_2$), a silicon nitride (e.g., $Si_xN_y$ such as $Si_3N_4$), a high-K dielectric material and/or another suitable material.

The layers of the dummy gate structures 336 may be formed using various semiconductor processing techniques such as deposition (e.g., by the deposition tool 102), patterning (e.g., by the exposure tool 104 and the developer tool 106), and/or etching (e.g., by the etch tool 108), among other examples. Examples include CVD, PVD, ALD, thermal oxidation, e-beam evaporation, photolithography, e-beam lithography, photoresist coating (e.g., spin-on coating), soft baking, mask aligning, exposure, post-exposure baking, photoresist developing, rinsing, drying (e.g., spin-drying and/or hard baking), dry etching (e.g., reactive ion etching), and/or wet etching, among other examples.

In some implementations, the gate dielectric layer 344 is conformally deposited on the semiconductor device 200 and then selectively removed from portions of the semiconductor device 200 (e.g., the source/drain areas). The gate electrode layer 338 is then deposited onto the remaining portions of the gate dielectric layer 344. The hard mask layers 340 are then deposited onto the gate electrode layers 338. The spacer layers 342 may be conformally deposited in a similar manner as the gate dielectric layer 344. In some implementations, the spacer layers 342 include a plurality of types of spacer layers. For example, the spacer layers 342 may include a seal spacer layer that is formed on the sidewalls of the dummy gate structures 336 and a bulk spacer layer that is formed on the seal spacer layer. The seal spacer layer and the bulk spacer layer may be formed of similar materials or different materials. In some implementations, the bulk spacer layer is formed without plasma surface treatment that is used for the seal spacer layer. In some implementations, the bulk spacer layer is formed to a greater thickness relative to the thickness of the seal spacer layer.

FIG. 3U further illustrates reference cross-sections that are used in later figures, including FIGS. 4A-4D. Cross-section A-A is in an x-z plane (referred to as a y-cut) across the fin structures 204 and the hybrid fin structures 334 in source/drain areas of the semiconductor device 200. Cross-section B-B is in a y-z plane (referred to as an x-cut) perpendicular to the cross-section A-A, and is across the dummy gate structures 336 in the source/drain areas of the semiconductor device 200. Cross-section C-C is in the x-z plane parallel to the cross-section A-A and perpendicular to the cross-section B-B, and is along a dummy gate structures 336. Subsequent figures refer to these reference cross-sections for clarity. In some figures, some reference numbers of components or features illustrated therein may be omitted to avoid obscuring other components or features for ease of depicting the figures.

As indicated above, the number and arrangement of operations and devices shown in FIGS. 3A-3U are provided as one or more examples. In practice, there may be additional operations and devices, fewer operations and devices, different operations and devices, or differently arranged operations and devices than those shown in FIGS. 3A-3U.

FIGS. 4A-4I are diagrams of an example implementation 400 described herein. The example implementation 400 includes an example of forming source/drain regions in the source/drain areas of the semiconductor device 200. FIGS. 4A-4I are illustrated from a plurality of perspectives illustrated in FIG. 3U, including the perspective of the cross-sectional plane A-A in FIG. 3U, the perspective of the cross-sectional plane B-B in FIG. 3U, and the perspective of the cross-sectional plane C-C in FIG. 3U. In some implementations, the operations described in connection with the example implementation 400 are performed after the operations described in connection with FIGS. 3A-3U.

Figure 4A:
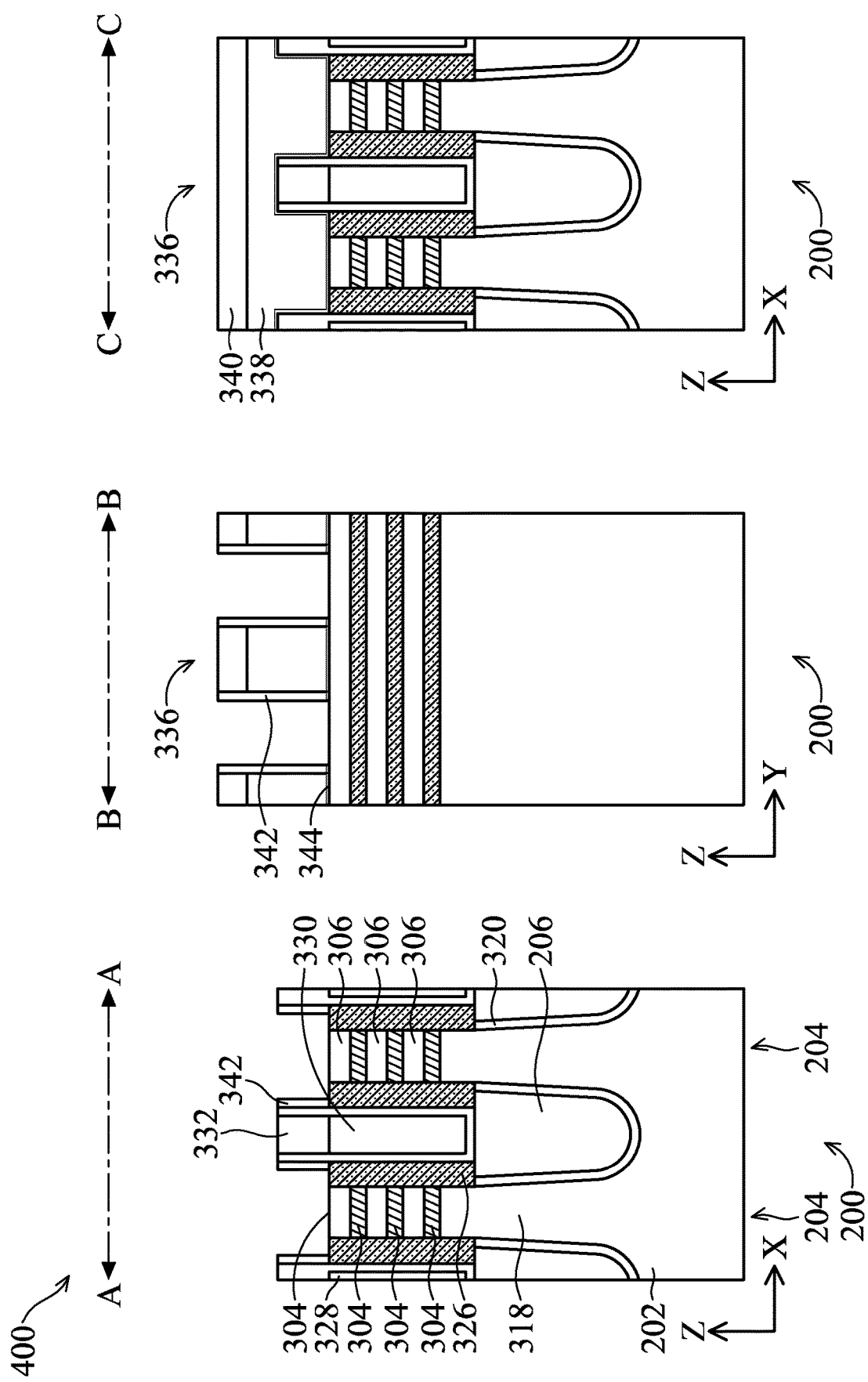

As shown in FIG. 4A, the dummy gate structures 336 are formed above the fin structures 204. As shown in the cross-sectional plane C-C in FIG. 4A, portions of the gate dielectric layer 344 and portions of the gate electrode layers 338 are formed in recesses above the fin structures 204 that are formed as a result of the removal of the hard mask layer 308. The formation of the dummy gate structures 336 is described in connection with FIG. 3U.

Figure 4B:
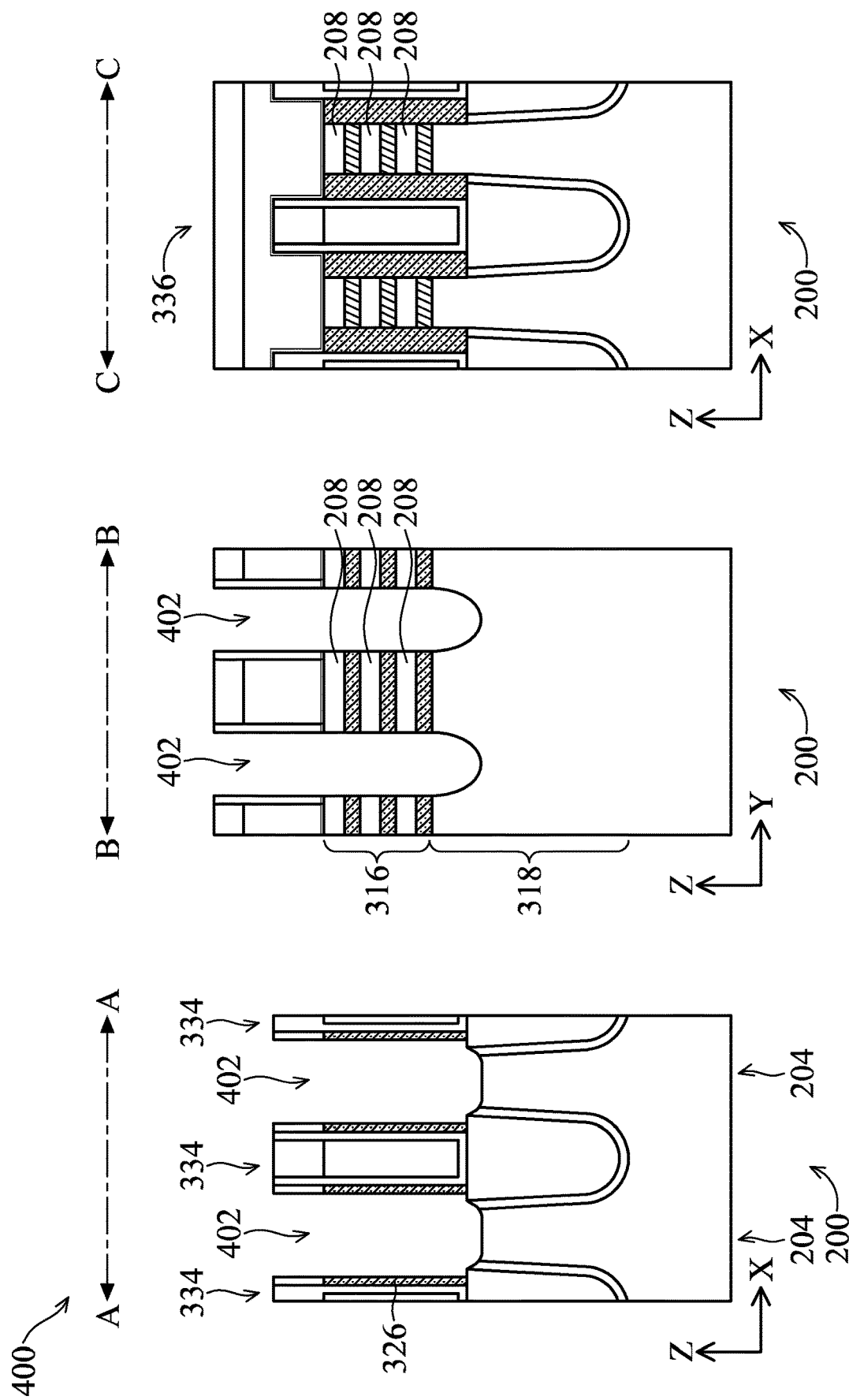

As shown in the cross-sectional plane A-A and cross-sectional plane B-B in FIG. 4B, source/drain recesses 402 are formed in the portions 316 of the fin structures 204 in an etch operation. The source/drain recesses 402 are formed to provide spaces in which source/drain regions 210 are to be formed on opposing sides of the dummy gate structures 336. The etch operation may be performed by the etch tool 108 and may be referred to a strained source/drain (SSD) etch operation. In some implementations, the etch operation includes a plasma etch technique, a wet chemical etch technique, and/or another type of etch technique. As shown in the cross-sectional plane A-A in FIG. 4B, a portion of the cladding sidewall layers 326 remain over the sidewalls of the hybrid fin structures 334 in the source/drain recesses 402.

As further shown in the cross-sectional plane A-A and cross-sectional plane B-B in FIG. 4B, the source/drain recesses 402 may further be formed into the portions 318 of the fin structures 204 (e.g., into the mesa region of the fin structures 204). In these implementations, the source/drain recesses 402 penetrate into a well portion (e.g., a p-well, an n-well) of the fin structures 204. In implementations in which the semiconductor substrate 202 includes a silicon (Si) material having a (100) orientation, (111) faces are formed at bottoms of the source/drain recesses 402, resulting in formation of a V-shape or a triangular shape cross-section at the bottoms of the source/drain recesses 402. In some implementations, a wet etching using tetramethylammonium hydroxide (TMAH) and/or a chemical dry etching using hydrochloric acid (HCl) are employed to form the V-shape profile.

As shown in the cross-sectional plane B-B and the cross-sectional plane C-C in FIG. 4B, portions of the first layers 304 and portions of the second layers 306 of the layer stack 302 remain under the dummy gate structures 336 after the etch operation to form the source/drain recesses 402. The portions of the second layers 306 under the dummy gate structures 336 form the channels 208 of the nanostructure transistors of the semiconductor device 200.

Figure 4C:
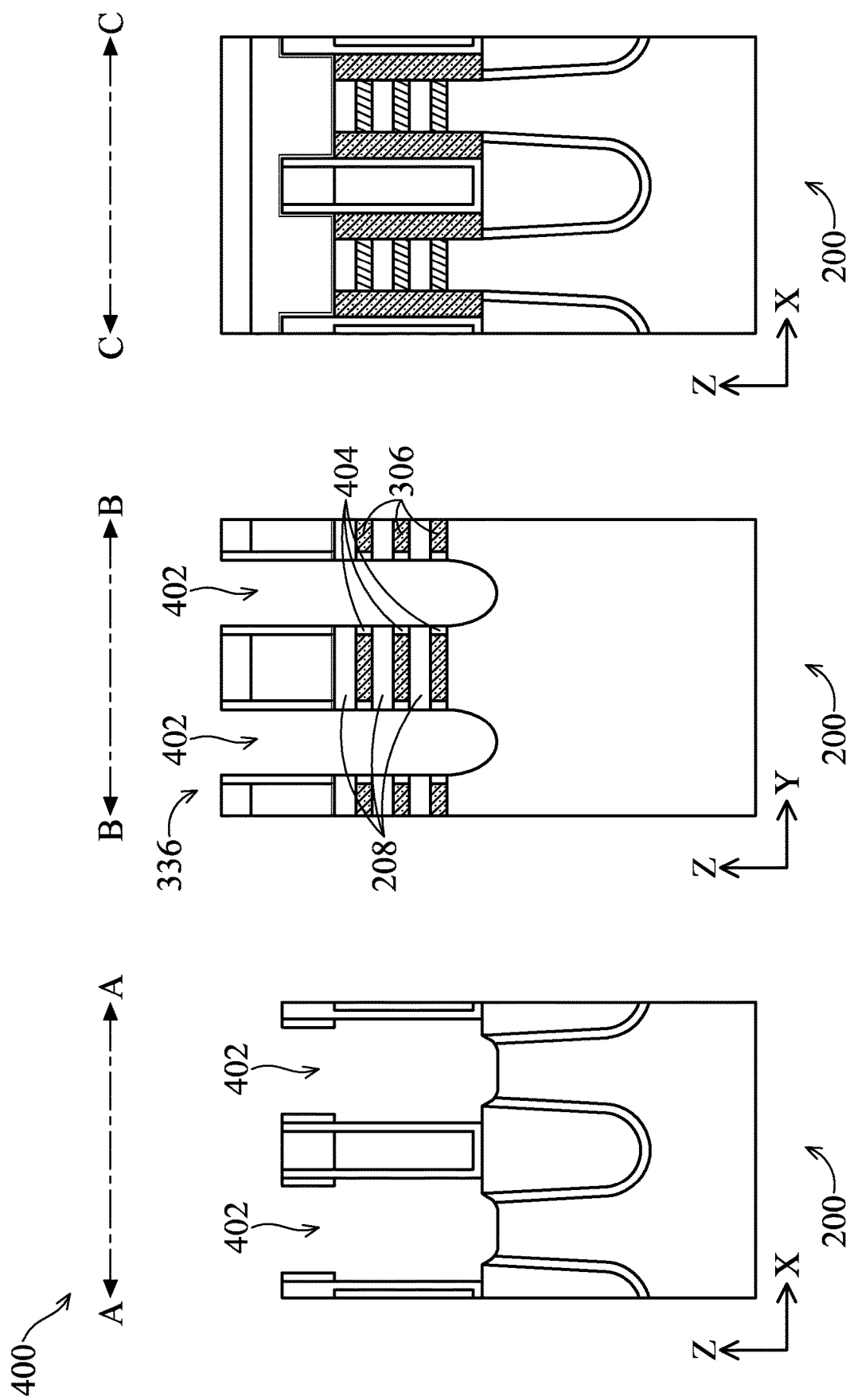

As further shown in the cross-sectional plane B-B in FIG. 4C, the deposition tool 102 forms inner spacer (InSP) layers 404 in cavities between the channels 208 prior to formation of the source/drain regions 210 in the source/drain recesses 402. The inner spacer layers 404 are included to provide increased isolation between the gate structures 212 (e.g., the replacement gate structures) and the source/drain regions 210 that are to be formed in the source/drain recesses 402 for reduced parasitic capacitance. The inner spacer layers 404 include a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonitride (SiOCN), and/or another dielectric material. The inner spacer layers 404 and the spacer layers 342 may be formed of the same material or of different materials.

The inner spacer layers 404 may be formed by etching (e.g., by the etch tool 108) the ends of the first layers 304 to form cavities between adjacent nanostructure channels 208. The etch tool 108 may laterally etch (e.g., in a direction that is approximately parallel to a length of the first layers 304) the first layers 304 in an etch operation, thereby forming the cavities (or recesses) between portions of the channels 208. In implementations where the first layers 304 are silicon germanium (SiGe) and the second layers 306 are silicon (Si), the etch tool 108 may selectively etch the first layers 304 using a wet etchant such as, a mixed solution including hydrogen peroxide ($H_2O_2$), acetic acid ($CH_3COOH$), and/or hydrogen fluoride (HF), followed by a cleaning with water ($H_2O$). The mixed solution and the wafer may be provided into the source/drain recesses 402 to etch the first layers 304 from the source/drain recesses 402. In some implementations, the etching by the mixed solution and cleaning by water is repeated approximately 10 times to approximately 20 times. The etching time by the mixed solution is in a range from about 1 minute to about 2 minutes in some implementations. The mixed solution may be used at a temperature in a range of approximately 60° Celsius to approximately 90° Celsius. However, other values for the parameters of the etch operation are within the scope of the present disclosure. The inner spacers layers 404 are then formed on the ends of the first layers 304 in the cavities. In some implementations, a conformal layer is deposited (e.g., by the deposition tool 102) in the source/drain recesses 402, and the etch tool 108 removes excess material of the conformal layer to form the inner spacer layers 404.

Figure 4D:
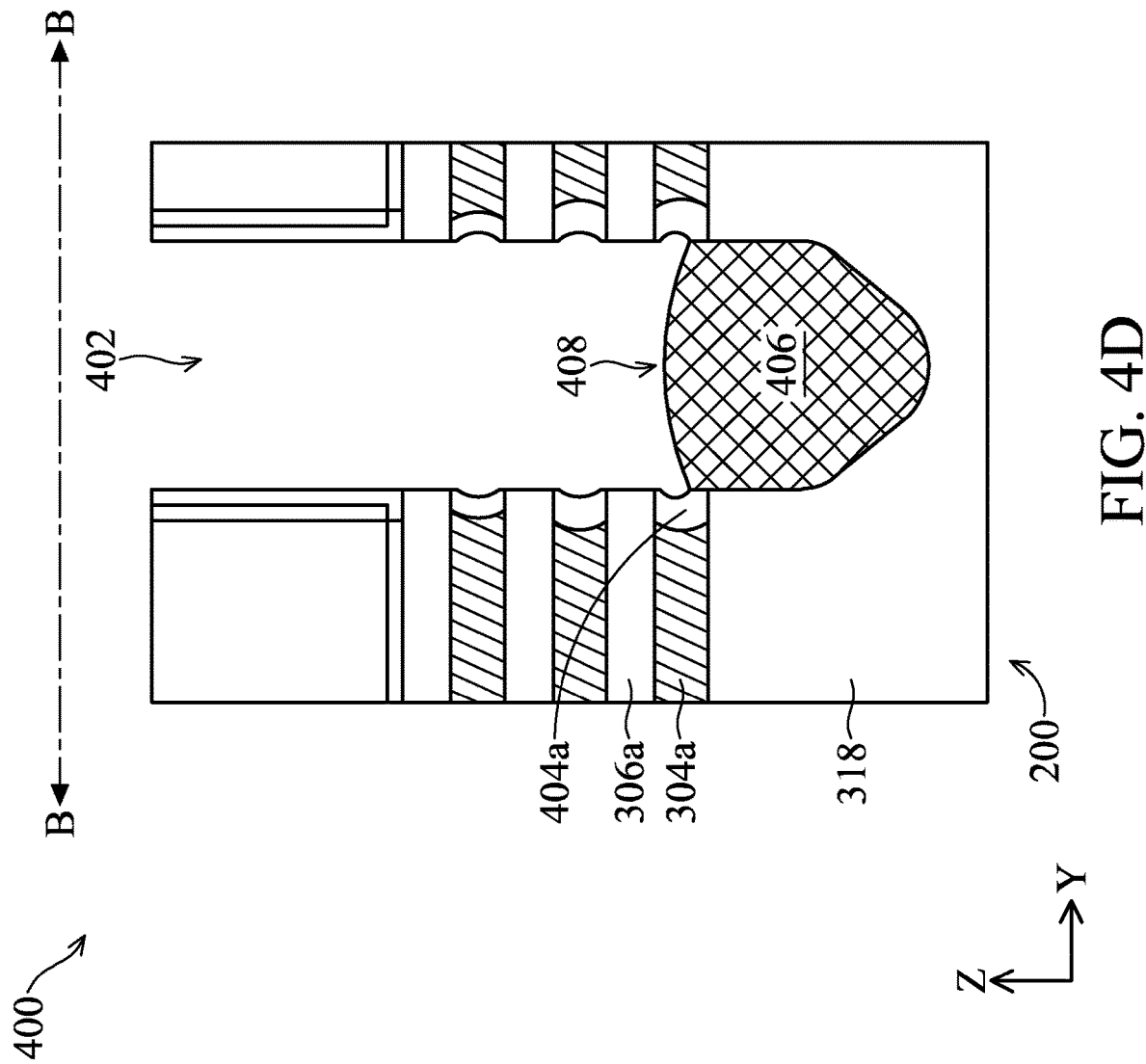

As shown in the cross-sectional plane B-B in FIG. 4D, the deposition tool 102 forms a buffer layer 406 (e.g., a buffer region) on a bottom of the source/drain recess 402. The buffer layer 406 may be considered a part of a source/drain region 210, or a separate layer on which a source/drain region 210 is formed. The buffer layer 406 may be included in the source/drain recess 402 to reduce current leakage under a source/drain region 210 that is to be formed in the source/drain recess 402. In some implementations, the buffer layer 406 is included to control the proximity and/or shape of the source/drain region 210.

The deposition tool 102 may deposit the buffer layer 406 using a CVD technique, a PVD technique, an ALD technique, an epitaxial growth technique, and/or another deposition technique. Deposition of the buffer layer 406 may be performed at a temperature in a range of approximately 650 degrees Celsius to approximately 750 degrees Celsius, at a pressure in a range of approximately 10 torr to approximately 300 torr, and/or using one or more other processing parameters. Precursors and/or process gasses that may be used in the deposition of the buffer layer 406 include germanium tetrahydride ($GeH_4$), hydrochloric acid (HCl), silicon tetrahydride ($SiH_4$), dichlorosilane (DCS or $SiH_2Cl_2$), phosphine ($PH_3$), diborane ($B_2H_6$), boron trichloride ($BCl_3$), hydrogen ($H_2$), and/or nitrogen ($N_2$), among other examples. In some implementations, the buffer layer 406 is formed such that a top surface of the buffer layer 406 exposed in the source/drain recess 402 includes a (100) grain orientation.

The buffer layer 406 may include an epitaxial material such as silicon (Si), silicon germanium (SiGe), silicon doped with boron (SiB) or another dopant, and/or another material. In implementations in which the buffer layer 406 includes silicon germanium, the germanium (Ge) concentration in the buffer layer 406 may be in a range of approximately 1% germanium to approximately 10% germanium. However, other values for the germanium concentration are within the scope of the present disclosure.

The buffer layer 406 includes a curved top surface 408. The deposition tool 102 and the etch tool 108 may perform a plurality of deposition and etch cycles to form the curved top surface 408 (e.g., a convex top surface) on the buffer layer 406 (e.g., on the epitaxial material). In some implementations, the deposition operation is performed first and the etch operation is performed second. In some implementations, the etch operation is performed first and the deposition operation is performed second.

FIG. 4D shows the buffer layer 406 in relation to a bottom inner spacer layer 404a, a bottom first layer 304a (e.g., a sacrificial layer), and a bottom second layer 306a (e.g., a nanostructure channel). The curved top surface 408 may include a convex shape having an apex height that is greater relative to a bottom surface of the bottom inner spacer layer 404a and/or greater relative to a bottom surface of the bottom first layer 304a. The apex height may also be lesser relative to a bottom surface of the bottom second layer 306a and/or lesser relative to a top surface of the bottom inner spacer layer 404a.

The curved top surface 408 may be included in a shaped region of the buffer layer 406 that prevent dopants (e.g., dopants from the source/drain region 210 subsequently formed above the buffer layer 406) from migrating into the portion 318 (e.g., the mesa region). Because the apex height of the curved top surface 408 (e.g., the height of the tallest part of the curved top surface 408) is located at or near a center of the buffer layer 406 due to the cyclic deposition and etch technique that is used to form the buffer layer 406, the height of the sides and/or ends of the buffer layer 406 adjacent to the portion 318 (e.g., the mesa portions) of the fin structure 204 is lesser relative to the height of the center of the buffer layer 406. Accordingly, the buffer layer 406 is formed such that the apex height is greater relative to the bottom surface of the bottom inner spacer layer 404a and/or greater relative to the bottom surface of the bottom first layer 304a to ensure that the sides or ends of the buffer layer 406 are formed tall enough to prevent exposure of the portion 318 (e.g., the mesa portions) of the fin structure 204 between the buffer layer 406 and the bottom inner spacer layer 404a (and the opposing bottom inner spacer on the other side of the source/drain recess 402). In other words, the buffer layer 406 is formed such that the apex height is greater relative to the bottom surface of the bottom inner spacer layer 404a and/or greater relative to the bottom surface of the bottom first layer 304a to ensure that the sides or ends of the buffer layer 406 fully cover the portion 318 (e.g., the mesa portions) of the fin structure 204. This ensures that there are no gaps between the buffer layer 406 and the bottom inner spacer layer 404a, which would otherwise provide a path for dopant migration and leakage into the portion 318 (e.g., the mesa portions) of the fin structure 204. By preventing such a migration, a likelihood of leakage into the portion 318 is reduced.

Figure 4E:
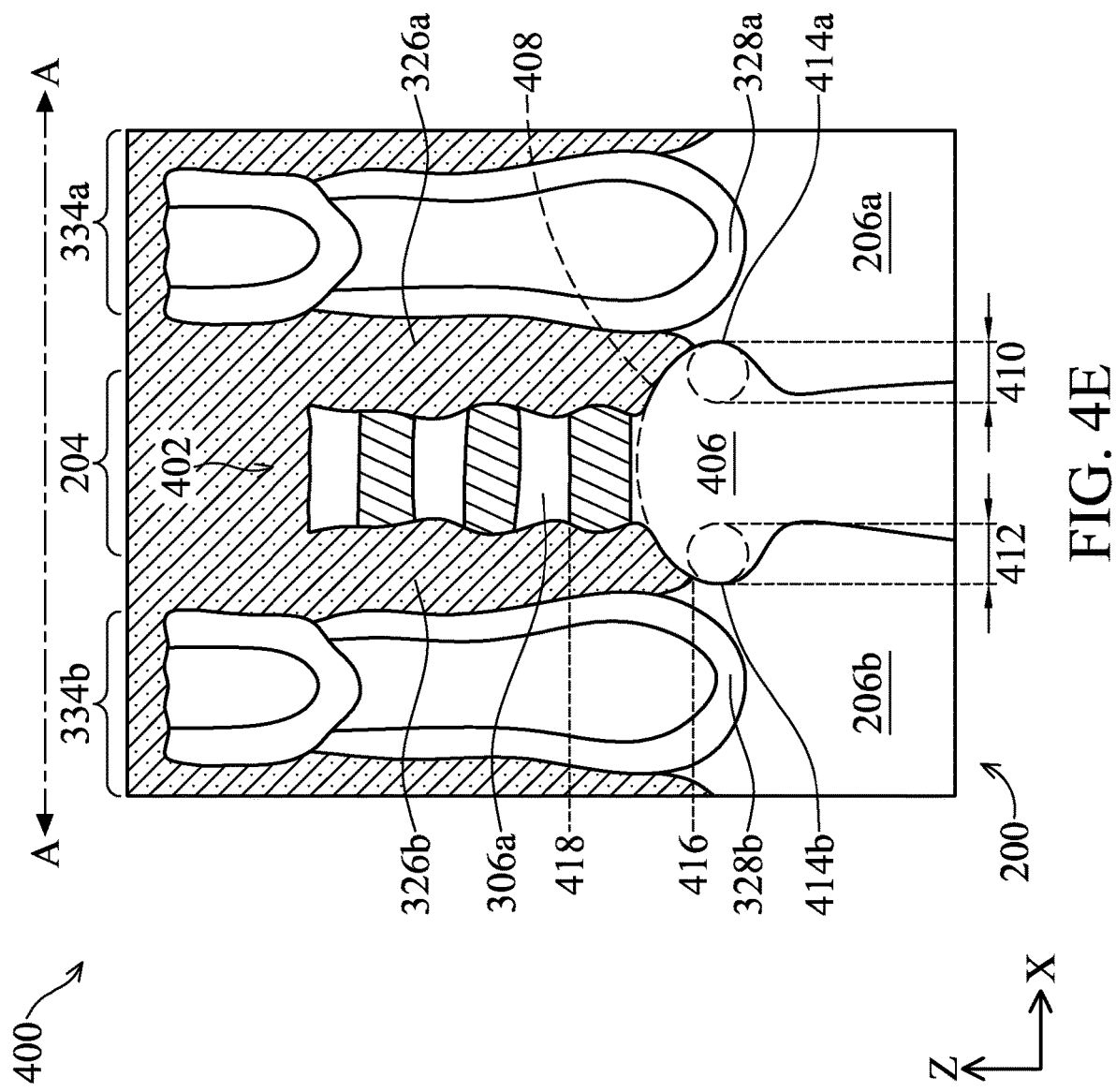

FIG. 4E shows a projection of a buffer layer 406 (e.g., the buffer region) and a source/drain recess 402 onto the cross-sectional plane A-A. In other words, the buffer layer 406, a plurality of hybrid fin structures 334, a plurality of STI regions 206, and the source/drain recess 402 are in the foreground of FIG. 4E, whereas a plurality of cladding sidewall layers 326 and a layer stack of alternating layers including second layers 306 and nanostructure channels 208 are in the background of FIG. 4E. As described in connection with FIG. 4B, portions of the cladding sidewall layers 326 may remain over the sidewalls of the hybrid fin structures 334 after formation the source/drain recesses 402. However, the remaining portions of some cladding sidewall layers 326 (e.g., a cladding sidewall layer 326a and a cladding sidewall layer 326b) may be removed in the source/drain recesses 402 during the etch operation to form the cavities in which the inner spacers layers 404 are formed. As a result, the sidewalls of the hybrid fin structure 334a and the hybrid fin structure 334b are exposed in the recess 402.

In FIG. 4E, a bottom second layer 306a (e.g., a bottom nanostructure channel) is above a portion of the fin structure 204. The hybrid fin structure 334a (e.g., a first hybrid fin structure) is adjacent to a first side of the fin structure 204, and the hybrid fin structure 334b (e.g., a second hybrid fin structure) is adjacent to a second side of the fin structure 204 that is opposite the first side. The buffer layer 406 is between the hybrid fin structure 334a and the hybrid fin structure 334b.

In some implementations, and as shown in FIG. 4E, a portion 414a (e.g., a first portion) of the buffer layer 406 extends into the STI region 206a (e.g., a first STI region) between the first side of the fin structure 204 and the hybrid fin structure 334a. The first side of the fin structure 204 may correspond to a first side of the bottom second layer 306a (e.g., a bottom nanostructure channel). Additionally, or alternatively, the portion 414a may extend into the liner 328a on a sidewall of the hybrid fin structure 334a. Accordingly, the portion 414a may be in physical contact with the hybrid fin structure 334a. Additionally, or alternatively, the portion 414a may extend along a cross-section of the cladding sidewall layer 326a.

The portion 414a of the buffer layer 406 may extend from the first side of the fin structure 204 towards the STI region 206a a distance 410 that is in a range of approximately 3 nanometers to approximately 10 nanometers from the first side of the fin structure 204. If the distance 410 is less than this range, the buffer layer 406 may not effectively reduce leakage in the portion 318 (e.g., the mesa region) and/or near a bottom second layer 306a (e.g., a bottom nanostructure channel). If the distance 410 is greater than this range, an interference between the buffer layer 406 and the hybrid fin structure 334a may develop. However, other values and ranges for the distance 410 are within the scope of the present disclosure.

A portion 414b (e.g., a second portion) of the buffer layer 406 may extend into the STI region 206b (e.g., a second STI region) that is between the second side of the fin structure 204 and the hybrid fin structure 334b. The second side of the fin structure 204 may correspond to a second side of the bottom second layer 306a (e.g., the bottom nanostructure channel). Additionally, or alternatively, the portion 416b may extend into the liner 328b on a sidewall of the hybrid fin structure 334b. Accordingly, the portion 414b may be in physical contact with the hybrid fin structure 334b. Additionally, or alternatively, the portion 416b may extend along a cross-section of the cladding sidewall layer 326b.

The portion 414b of the buffer layer 406 may extend from the second side of the fin structure 204 towards the STI region 206b a distance 412 that is in a range of approximately 3 nanometers to approximately 10 nanometers from the second side of the fin structure 204. If the distance 412 is less than this range, the buffer layer 406 may not effectively reduce leakage into the fin structure 204 (e.g., leakage from the source/drain region 210 of the semiconductor device 200 in completed form). If the distance 412 is greater than this range, an interference between the buffer layer 406 and the hybrid fin structure 334b may develop. However, other values and ranges for the distance 412 are within the scope of the present disclosure.

In some implementations, and as shown in FIG. 4E, the curved top surface 408 includes an apex height that is greater relative to a height 416 of the STI region 206a and the STI region 206b. The apex height is lesser relative to a height 418 of a bottom surface of the bottom second layer 306a (e.g., a bottom surface of the bottom nanostructure channel).

Figure 4F:
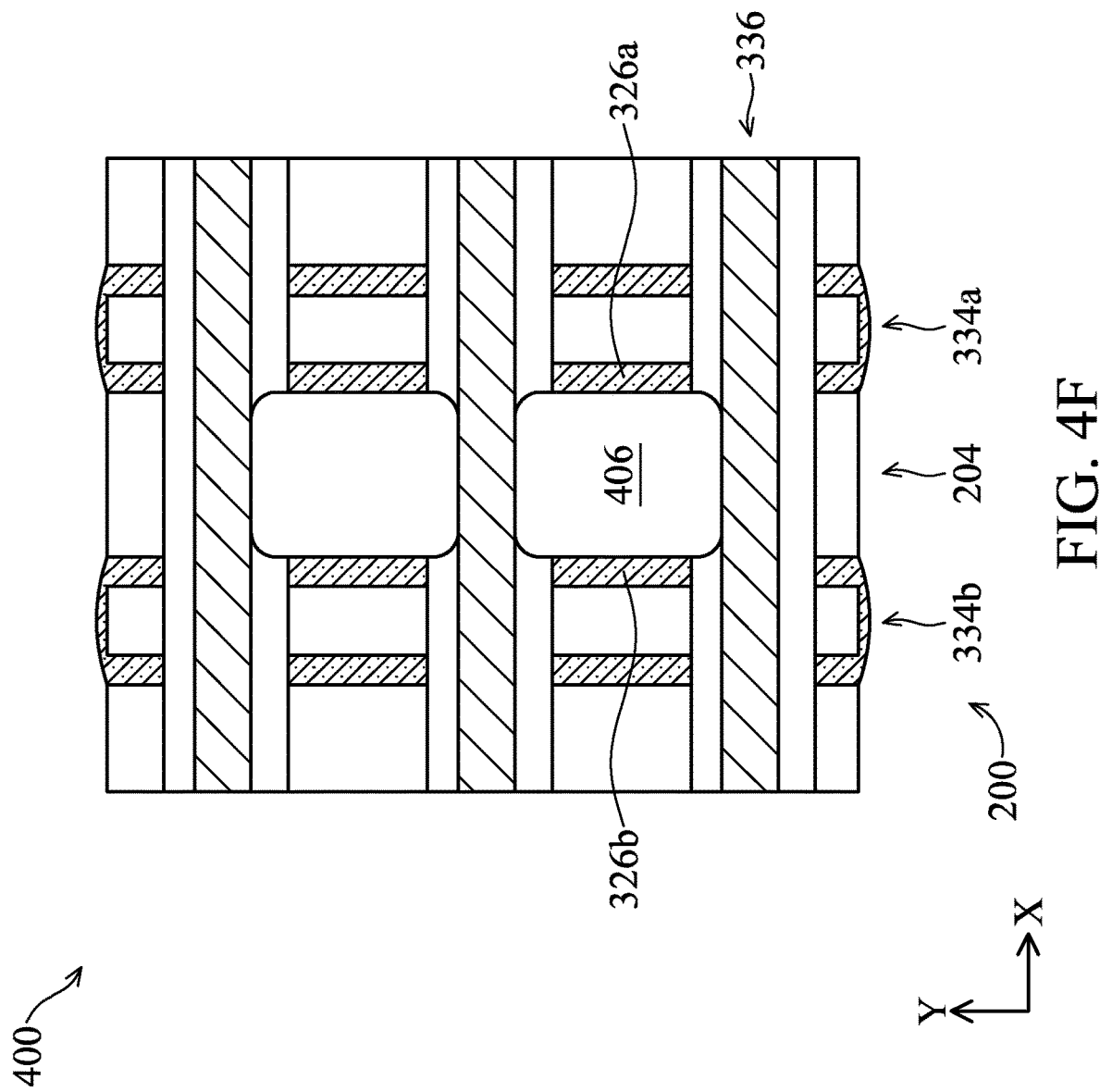

FIG. 4F shows a top view of the semiconductor device 200. As shown, a perimeter of the buffer layer 406 is between the hybrid fin structure 334a and the hybrid fin structure 334b. The perimeter of the buffer layer 406 is also contained within a footprint defined by the cladding sidewall layer 326a, the dummy gate structure 336, and the cladding sidewall layer 326b.

Figure 4G:
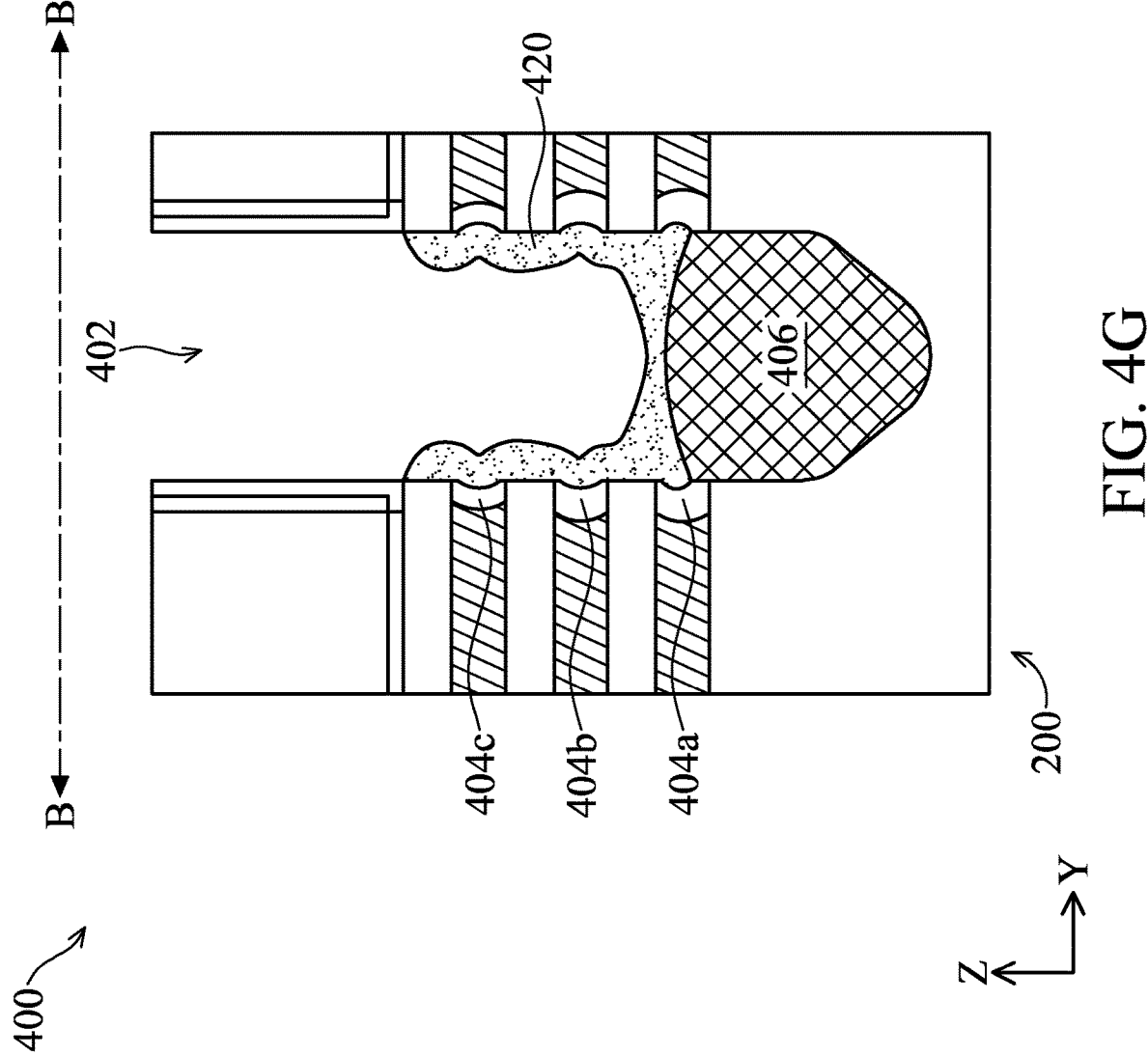

As shown in FIG. 4G, a layer 420 (e.g., a second layer of epitaxial material) is formed in the source/drain recess 402 over and/or on the buffer layer 406. The layer 420 may be included to function as a shielding layer to reduce short channel effects in the semiconductor device 200. The layer 420 is conformally deposited at the bottom of the source/drain recess 402 and on the sidewalls of the source/drain recess 402 (e.g., the inner spacer layers 404a, 404b, and 404c).

The deposition tool 102 may deposit the layer 420 using a CVD technique, a PVD technique, an ALD technique, an epitaxial growth technique, and/or another deposition technique. Deposition of the layer 420 may be performed at a temperature in a range of approximately 600 degrees Celsius to approximately 700 degrees Celsius, at a pressure in a range of approximately 10 torr to approximately 300 torr, and/or using one or more other processing parameters. Precursors and/or process gasses that may be used in the deposition of the layer 420 include germanium tetrahydride ($GeH_4$), hydrochloric acid (HCl), silicon tetrahydride ($SiH_4$), dichlorosilane (DCS or $SiH_2Cl_2$), phosphine ($PH_3$), diborane ($B_2H_6$), boron trichloride ($BCl_3$), hydrogen ($H_2$), and/or nitrogen ($N_2$), among other examples.

The deposition tool 102 and the etch tool 108 may perform a plurality of deposition and etch cycles to form the layer 420. Each deposition and etch cycle includes a deposition operation and an etch operation. In some implementations, the deposition operation is performed first and the etch operation is performed second. In some implementations, the etch operation is performed first and the deposition operation is performed second. In some implementations, the deposition tool 102 and the etch tool 108 perform a quantity of deposition and etch cycles that is in a range of approximately 50 cycles to approximately 60 cycles to form the layer 420 to a sufficient thickness, and such that a continuous layer of materials is formed for the layer 420 without forming the layer 420 too thick so as to cause issues with filling the remainder of the source/drain region 210 in the source/drain recess 402.

The deposition operation may include the deposition tool 102 depositing one or more silicon precursors (e.g., silicon tetrahydride ($SiH_4$) and/or another silicon precursor), one or more germanium precursors (e.g., germanium tetrahydride ($GeH_4$) and/or another germanium precursor), and/or one or more dopants (e.g., diborane ($B_2H_6$) and/or another dopant) using a process gas (e.g., hydrogen ($H_2$) and/or another process gas). The etch operation may include the etch tool 108 using an etchant such as hydrochloric acid (HCl) and/or another etchant. The combination of deposition operations and etch operations in a cyclical manner increases control over the continuity of the layer 420 and control over the thickness of the layer 420. In particular, the use of silicon tetrahydride as a silicon precursor in the deposition operation increases the deposition rate of the layer 420 increases the likelihood of forming a continuous layer of material for the layer 420, and use of hydrochloric acid as an etchant facilitates maintaining a relatively low thickness for the layer 420.

In some implementations, a combination of silicon tetrahydride and dichlorosilane (DCS or $SiH_2Cl_2$) is used to deposit the layer 420. In these implementations, a ratio of silicon tetrahydride to dichlorosilane may be in a range of greater than approximately 5:1 to approximately 7:1 to increase the likelihood of forming a continuous layer of material for the layer 420. However, other values for the ratio are within the scope of the present disclosure. In implementations in which a ratio between a dopant (e.g., diborane) and silicon precursor is in a particular range (e.g., approximately 0.1:1 to approximately 0.3:1 or another range), the ratio of dichlorosilane to silicon tetrahydride may be in a range of approximately 5:1 to approximately 10:1 to reduce defect formation and to provide sufficient deposition selectivity. However, other values for the ratio are within the scope of the present disclosure.

In some implementations, a deposition operation and an etch operation of a deposition and etch cycle may be performed using the same processing parameters (e.g., the same pressure, the same temperature). In some implementations, a deposition operation and an etch operation of a deposition and etch cycle may be performed using different processing parameters. For example, the etch operation may be performed at a greater temperature relative to the deposition operation. As another example, the etch operation may be performed at a greater pressure relative to the deposition operation. In some implementations, the deposition operation is performed at a temperature in a range of approximately 600 degrees Celsius to approximately 650 degrees Celsius whereas the etch operation is performed at a temperature in a range of approximately 630 degrees Celsius to approximately 680 degrees Celsius. However, other values for the temperatures of the deposition operation and the etch operation are within the scope of the present disclosure. In some implementations, the etch operation is performed at approximately twice the pressure as the etch operation to control the etch direction in the etch operation.

The layer 420 may include silicon (Si), silicon germanium (SiGe), doped silicon (e.g., silicon doped with arsenic (SiAs) or another dopant), doped silicon germanium (e.g., silicon germanium doped with boron (SiGe:B) or another dopant), and/or another material. In implementations in which the layer 420 includes silicon germanium, the germanium (Ge) concentration in the layer 420 may be in a range of approximately 20% germanium to approximately 40% germanium. However, other values for the germanium concentration are within the scope of the present disclosure. The layer 420 may include a lightly doped layer. For example, the doping concentration of arsenic (As) of the layer 420 (e.g., where the layer 420 includes silicon) may be in a range of approximately $5 \times 10^{20}$ atoms per cubic centimeter to approximately $2 \times 10^{20}$ atoms per cubic centimeter. As another example, the doping concentration of boron (B) of the layer 420 (e.g., where the layer 420 includes silicon germanium) may be in a range of approximately $1 \times 10^{20}$ atoms per cubic centimeter to approximately $8 \times 10^{20}$ atoms per cubic centimeter. However, other values for the dopant range are within the scope of the present disclosure.

Figure 4H:
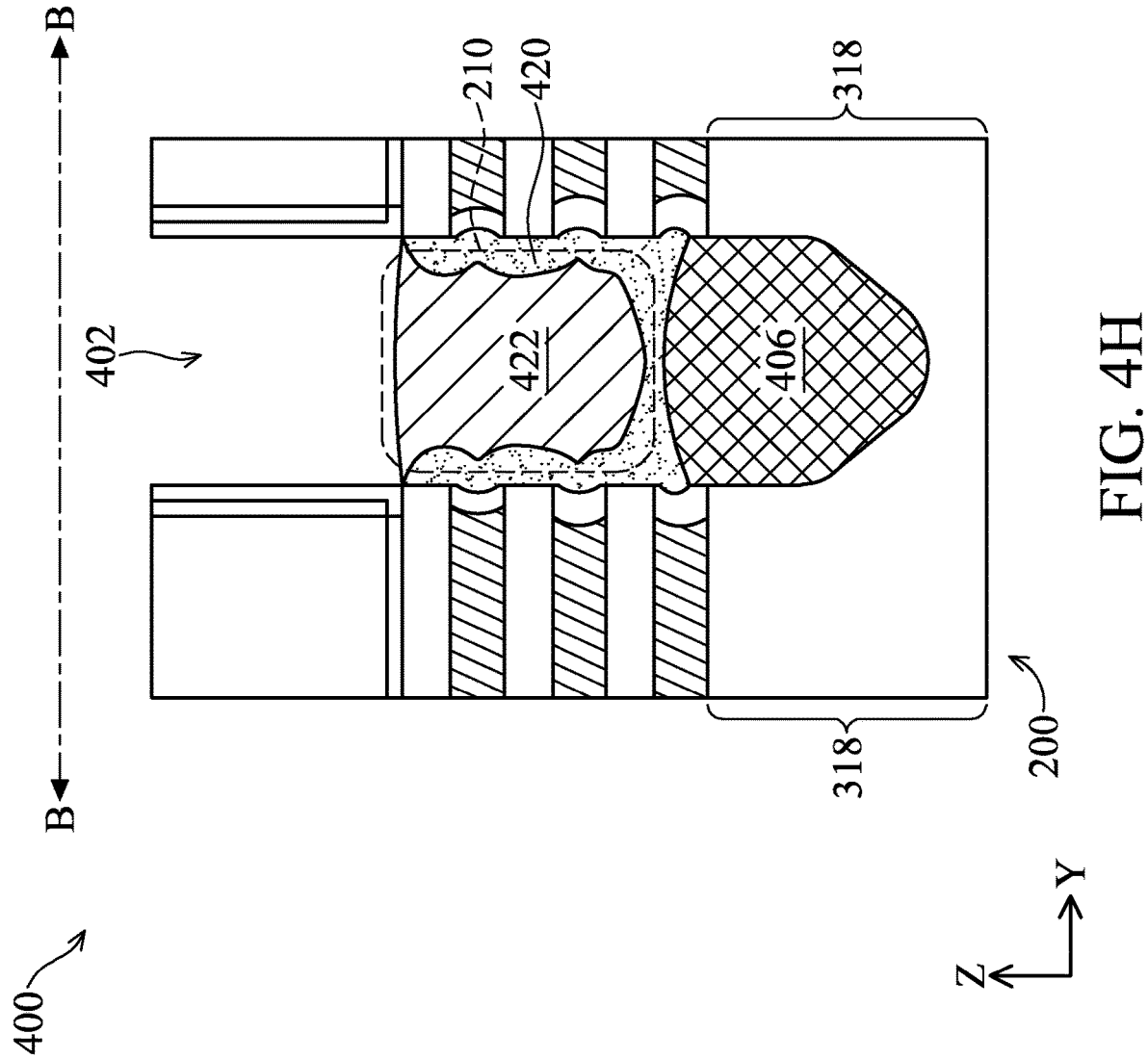

As shown in FIG. 4H, a layer 422 (e.g., a third layer of a third epitaxial material) is formed in the source/drain recess 402 over and/or on the layer 420. The deposition tool 102 may deposit the layer 422 using a CVD technique, a PVD technique, an ALD technique, an epitaxial growth technique, and/or another deposition technique. Deposition of the layer 422 may be performed at a temperature in a range of approximately 600 degrees Celsius to approximately 700 degrees Celsius, at a pressure in a range of approximately 10 torr to approximately 300 torr, and/or using one or more other processing parameters. Precursors and/or process gasses that may be used in the deposition of the layer 422 include germanium tetrahydride (GeH$_4$), hydrochloric acid (HCl), silicon tetrahydride (SiH$_4$), dichlorosilane (DCS or SiH$_2$Cl$_2$), phosphine (PH$_3$), diborane (B$_2$H$_6$), boron trichloride (BCl$_3$), hydrogen (H$_2$), and/or nitrogen (N$_2$), among other examples.

The layer 422 may include silicon (Si), silicon germanium (SiGe), doped silicon (e.g., silicon doped with phosphorous (SiP) or another dopant), doped silicon germanium (e.g., silicon germanium doped with boron (SiGe:B) or another dopant), and/or another material. In some implementations, the layer 420 and the layer 422 are formed of the same material. In some implementations, the layer 420 and the layer 422 are formed of different materials. In implementations in which the layer 422 includes silicon germanium, the germanium (Ge) concentration in the layer 422 may be in a range of approximately 40% germanium to approximately 60% germanium. However, other values for the germanium concentration are within the scope of the present disclosure. The layer 422 may include a highly doped layer, and the doping concentration of the layer 422 may be greater relative to the doping concentration of the layer 420. For example, the doping concentration of boron (B) of the layer 422 (e.g., where the layer 422 includes silicon germanium) may be in a range of approximately $8\times10^{20}$ atoms per cubic centimeter to approximately $3\times10^{20}$ atoms per cubic centimeter. As another example, the doping concentration of phosphor (P) of the layer 422 (e.g., where the layer 422 includes silicon) may be in a range of approximately $1\times10^{21}$ atoms per cubic centimeter to approximately $5\times10^{21}$ atoms per cubic centimeter. However, other values for the dopant range are within the scope of the present disclosure.

The source/drain region 210 may include a combination of the layer 420 and the layer 422. In some implementations, a shaped portion of the buffer layer 406 (e.g., a combination of the portion 414a, the portion 414b, and the curved top surface 408) reduces a likelihood of dopants of the source/drain region 210 from migrating into the portion 318 of the fin structure 204 (e.g., the mesa portions on opposing sides of the buffer layer 406). For example, the shaped portion of the buffer layer 406 may prevent the layers 420 and 422 from touching the portion 318 and providing a path for dopant migration. By reducing the likelihood of the dopants of the source/drain region 210 from migrating into the portion 318 of the fin structure 204, a likelihood of leakage due to electron tunneling (e.g., electron tunneling within the portion 318 of the fin structure 204 and/or the second layers 306) may be reduced.

Figure 4I:
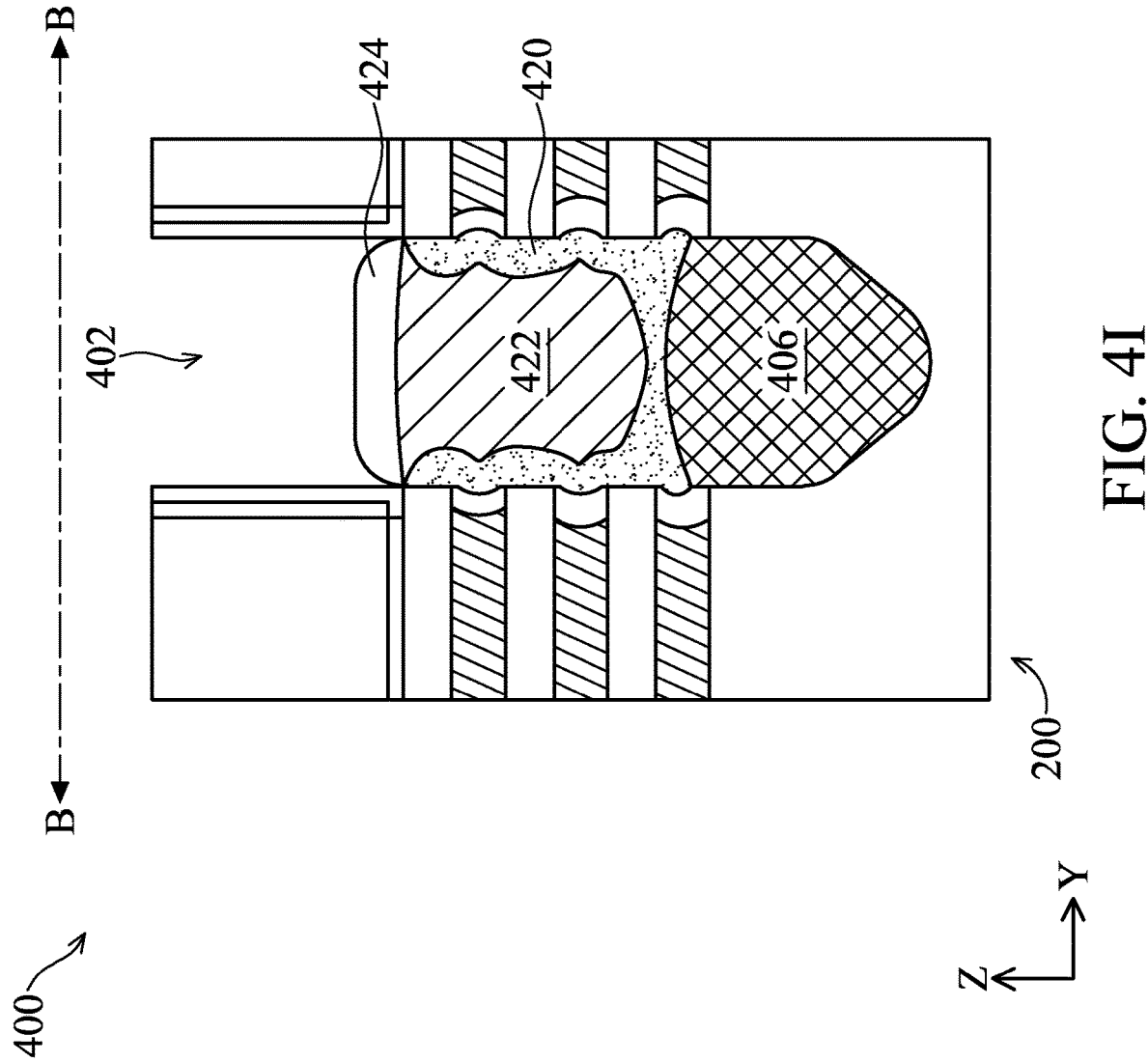

As shown in FIG. 4I, a capping layer 424 is formed in the source/drain recess 402 over and/or on the layer 422. The capping layer 424 may be considered a part of the source/drain region 210 (e.g., an L3 layer of the source/drain region 210) or a separate layer from the source/drain region 210. The capping layer 424 may be included to reduce dopant diffusion and to protect the source/drain region 210 in subsequent semiconductor processing operations for the semiconductor device 200 prior to contact formation.

The deposition tool 102 may deposit the capping layer 424 using a CVD technique, a PVD technique, an ALD technique, an epitaxial growth technique, and/or another deposition technique. Deposition of the capping layer 424 may be performed at a temperature in a range of approximately 600 degrees Celsius to approximately 700 degrees Celsius, at a pressure in a range of approximately 10 torr to approximately 300 torr, and/or using one or more other processing parameters. Precursors and/or process gasses that may be used in the deposition of the capping layer 424 include germanium tetrahydride (GeH$_4$), hydrochloric acid (HCl), silicon tetrahydride (SiH$_4$), dichlorosilane (DCS or SiH$_2$Cl$_2$), phosphine (PH$_3$), diborane (B$_2$H$_6$), boron trichloride (BCl$_3$), hydrogen (H$_2$), and/or nitrogen (N$_2$), among other examples.

The capping layer 424 may include silicon (Si), silicon germanium (SiGe), doped silicon (e.g., silicon doped with phosphorous (SiP) or another dopant), doped silicon germanium (e.g., silicon germanium doped with boron (SiGe:B) or another dopant), and/or another material. In implementations in which the capping layer 424 includes silicon germanium, the germanium (Ge) concentration in the capping layer 424 may be in a range of approximately 45% germanium to approximately 55% germanium. However, other values for the germanium concentration are within the scope of the present disclosure. The capping layer 424 may be referred to as a lightly doped layer in that doping concentration (e.g., the boron (B) doping concentration of silicon germanium) of the capping layer 424 may be in a range of approximately $1\times10^{21}$ atoms per cubic centimeter to approximately $2\times10^{21}$ atoms per cubic centimeter. However, other values for the dopant range are within the scope of the present disclosure.

The capping layer 424 may include silicon, silicon germanium, doped silicon, doped silicon germanium, and/or another material. The capping layer 424 may be included to reduce dopant diffusion and to protect the source/drain regions 210 in subsequent semiconductor processing operations for the semiconductor device 200 prior to contact formation.

As indicated above, the number and arrangement of operations and devices shown in FIGS. 4A-4I are provided as one or more examples. In practice, there may be additional operations and devices, fewer operations and devices, different operations and devices, or differently arranged operations and devices than those shown in FIGS. 4A-4I.

FIGS. 5A-5D are diagrams of an example implementation 500 described herein. The example implementation 500 includes an example of a replacement gate process (RPG) for replacing the dummy gate structures 336 with the gate structures 212 (e.g., the replacement gate structures) of the semiconductor device 200. FIGS. 5A-5D are illustrated from a plurality of perspectives illustrated in FIG. 3U, including the perspective of the cross-sectional plane A-A in FIG. 3U, the perspective of the cross-sectional plane B-B in FIG. 3U, and the perspective of the cross-sectional plane C-C in FIG. 3U. In some implementations, the operations described in connection with the example implementation 500 are performed after the operations described in connection with FIGS. 3A-3U and/or after the operations described in connection with FIGS. 4A-4D.

Figure 5A:
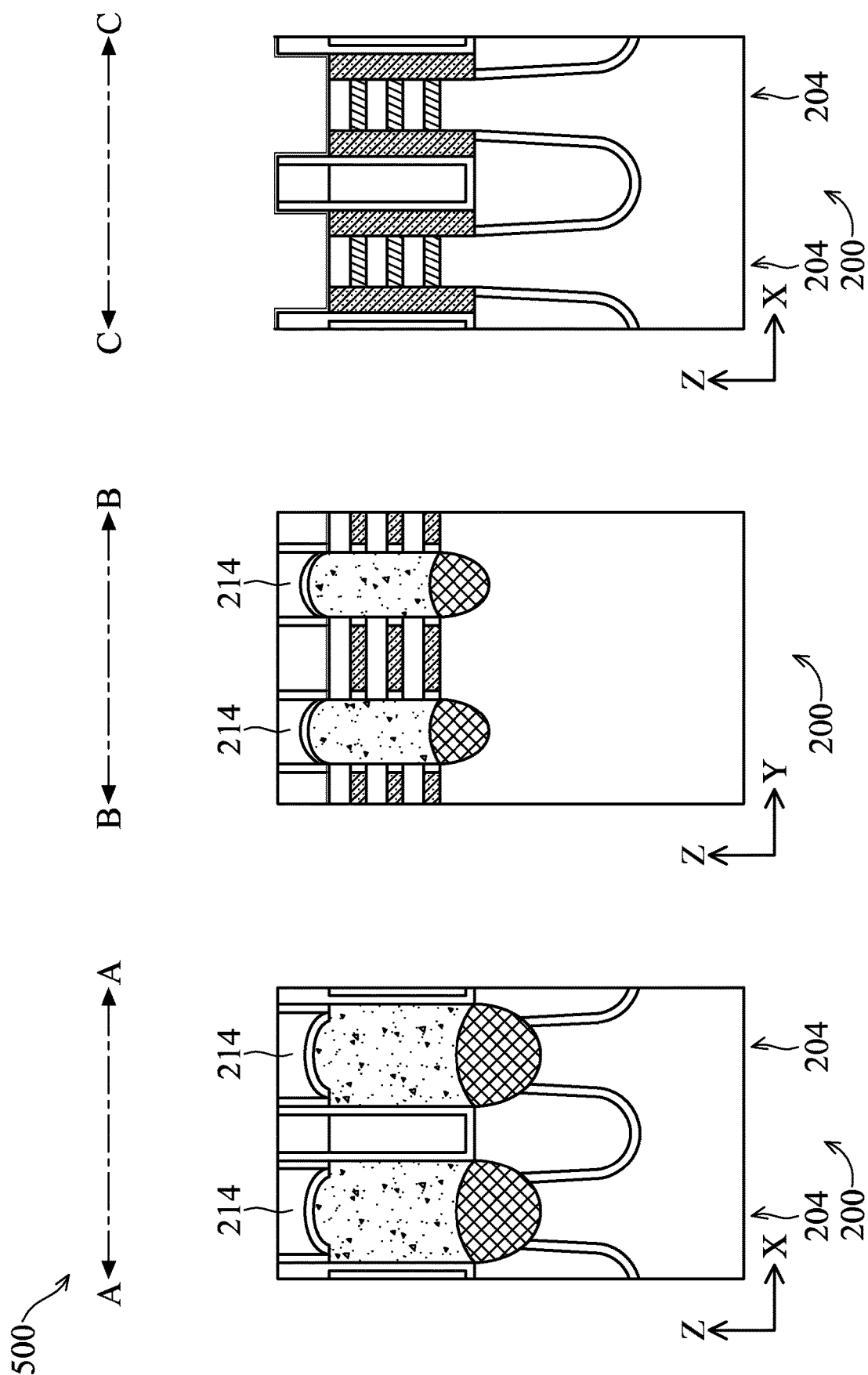

As shown in the cross-sectional plane A-A and the cross-sectional plane B-B in FIG. 5A, the dielectric layer 214 is formed over the source/drain regions 210 and the buffer layer 406. The dielectric layer 214 fills in areas between the dummy gate structures 336, between the hybrid fin structures 334, and over the source/drain regions 210. The dielectric layer 214 is formed to reduce the likelihood of and/or prevent damage to the source/drain regions 210 during the replacement gate process. The dielectric layer 214 may be referred to as an interlayer dielectric (ILD) zero (ILD0) layer or another ILD layer.

In some implementations, a contact etch stop layer (CESL) is conformally deposited (e.g., by the deposition tool 102) over the source/drain regions 210, over the dummy gate structures 336, and on the spacer layers 342 prior to formation of the dielectric layer 214. The dielectric layer 214 is then formed on the CESL. The CESL may provide a mechanism to stop an etch process when forming contacts or vias for the source/drain regions 210. The CESL may be formed of a dielectric material having a different etch selectivity from adjacent layers or components. The CESL may include or may be a nitrogen containing material, a silicon containing material, and/or a carbon containing material. Furthermore, the CESL may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL may be deposited using a deposition process, such as ALD, CVD, or another deposition technique.

Figure 5B:
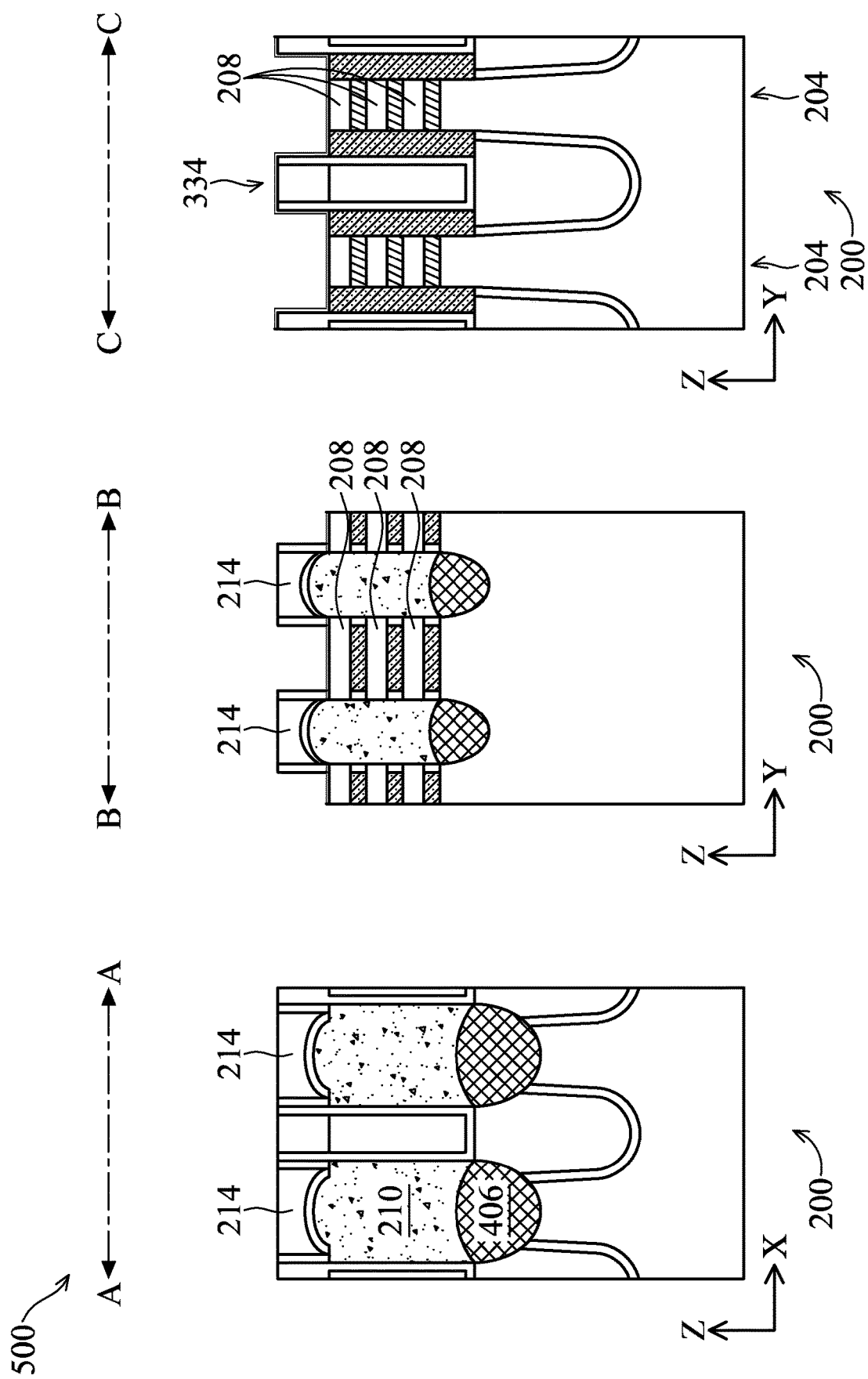

As shown in the cross-sectional plane B-B and the cross-sectional plane C-C in FIG. 5B, the replacement gate operation is performed (e.g., by one or more of the semiconductor processing tools 102-112) to remove the dummy gate structures 336 from the semiconductor device 200. The removal of the dummy gate structures 336 leaves behind openings (or recesses) between the dielectric layer 214 over the source/drain regions 210, and between the hybrid fin structures 334 over the fin structures 204. The dummy gate structures 336 may be removed in one or more etch operations. Such etch operations may include a plasma etch technique, a wet chemical etch technique, and/or another type of etch technique.

Figure 5C:
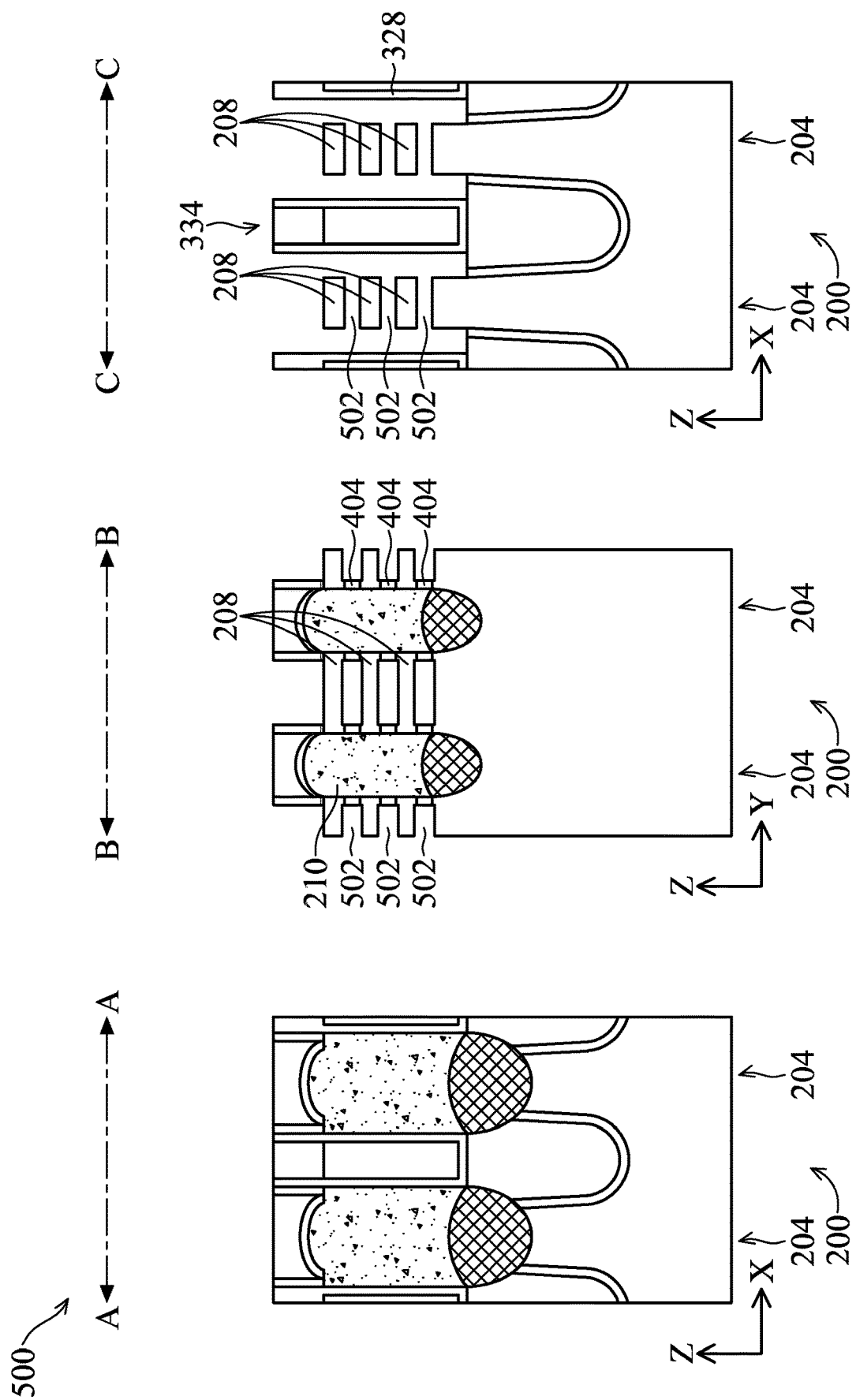

As shown in the cross-sectional plane B-B and the cross-sectional plane C-C in FIG. 5C, a nanostructure release operation is performed to remove the first layers 304 (e.g., the silicon germanium layers). This results in openings 502 between the channels 208 (e.g., the areas around the channels 208). The nanostructure release operation may include the etch tool 108 performing an etch operation to remove the first layer 304 based on a difference in etch selectivity between the material of the first layers 304 and the material of the channels 208, and between the material of the first layers 304 and the material of the inner spacer layers 404. The inner spacer layers 404 may function as etch stop layers in the etch operation to protect the source/drain regions 210 from being etched. As further shown in FIG. 5C, the cladding sidewall layers 326 are removed in the nanostructure release operation. This provides access to the areas around the nanostructure channels 208, which enables a replacement gate structure to be formed fully around the nanostructure channels 208.

Figure 5D:
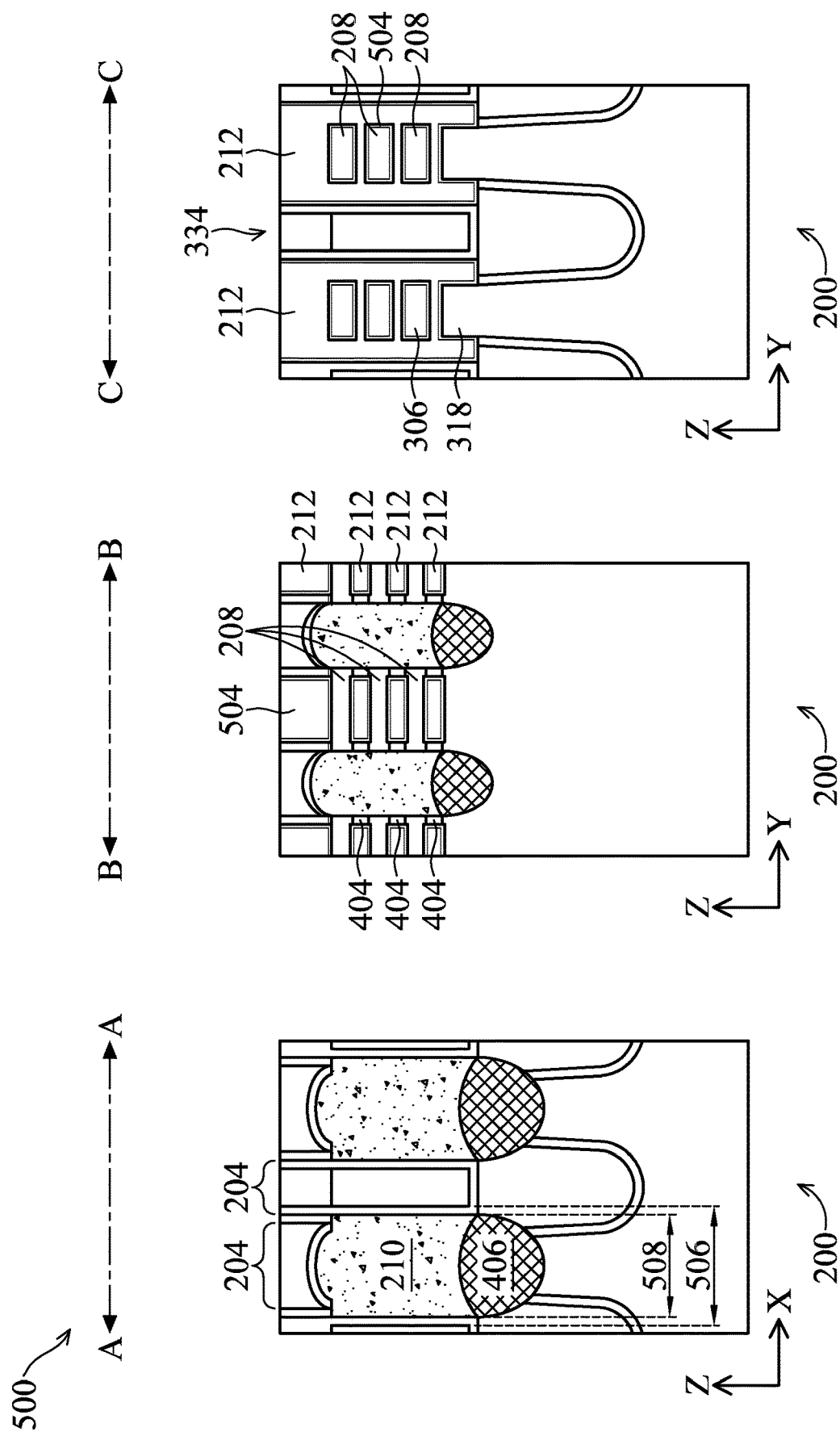

As shown in the cross-sectional plan B-B and the cross-sectional plane C-C in FIG. 5D, the replacement gate operation continues where deposition tool 102 and/or the plating tool 112 forms the gate structures (e.g., replacement gate structures) 212 in the openings 502 between the source/drain regions 210 and between the hybrid fin structures 334. In particular, the gate structures 212 fill the areas between and around the channels 208 such that the gate structures 212 surround the channels 208. The gate structures 212 may include metal gate structures. A conformal high-k dielectric liner 504 may be deposited onto the channels 208 and on sidewalls prior to formation of the gate structures 212. The gate structures 212 may include additional layers such as an interfacial layer, a work function tuning layer, and/or a metal electrode structure, among other examples.

FIG. 5D shows further properties of the source/drain region 210 in relation to the buffer layer 406. In some implementations, a width 506 (e.g., a first width) of the shaped region of the buffer layer 406 (e.g., a width from a side edge of the first portion 414a to a side edge of the second portion 414b) is greater relative to a width 508 (e.g., a second width) of the source/drain region 210. As an example, the width 506 may be greater relative to the width 508 in a range of approximately 1 nanometer to approximately 10 nanometers. If the width 506 is less than this range, the buffer layer 406 may not effectively prevent dopant extrusion from the source/drain region 210 and leakage (e.g., leakage within the fin structure 204 or in/near a bottom second layer 306a/nanostructure channel) may increase. If the width 506 is greater than this range, an interference between the buffer layer 406 and the hybrid fin structure 334 may develop. However, other values and ranges for the width 506 are within the scope of the present disclosure.

As indicated above, the number and arrangement of operations and devices shown in FIGS. 5A-5D are provided as one or more examples. In practice, there may be additional operations and devices, fewer operations and devices, different operations and devices, or differently arranged operations and devices than those shown in FIGS. 5A-5D.

Figure 6:
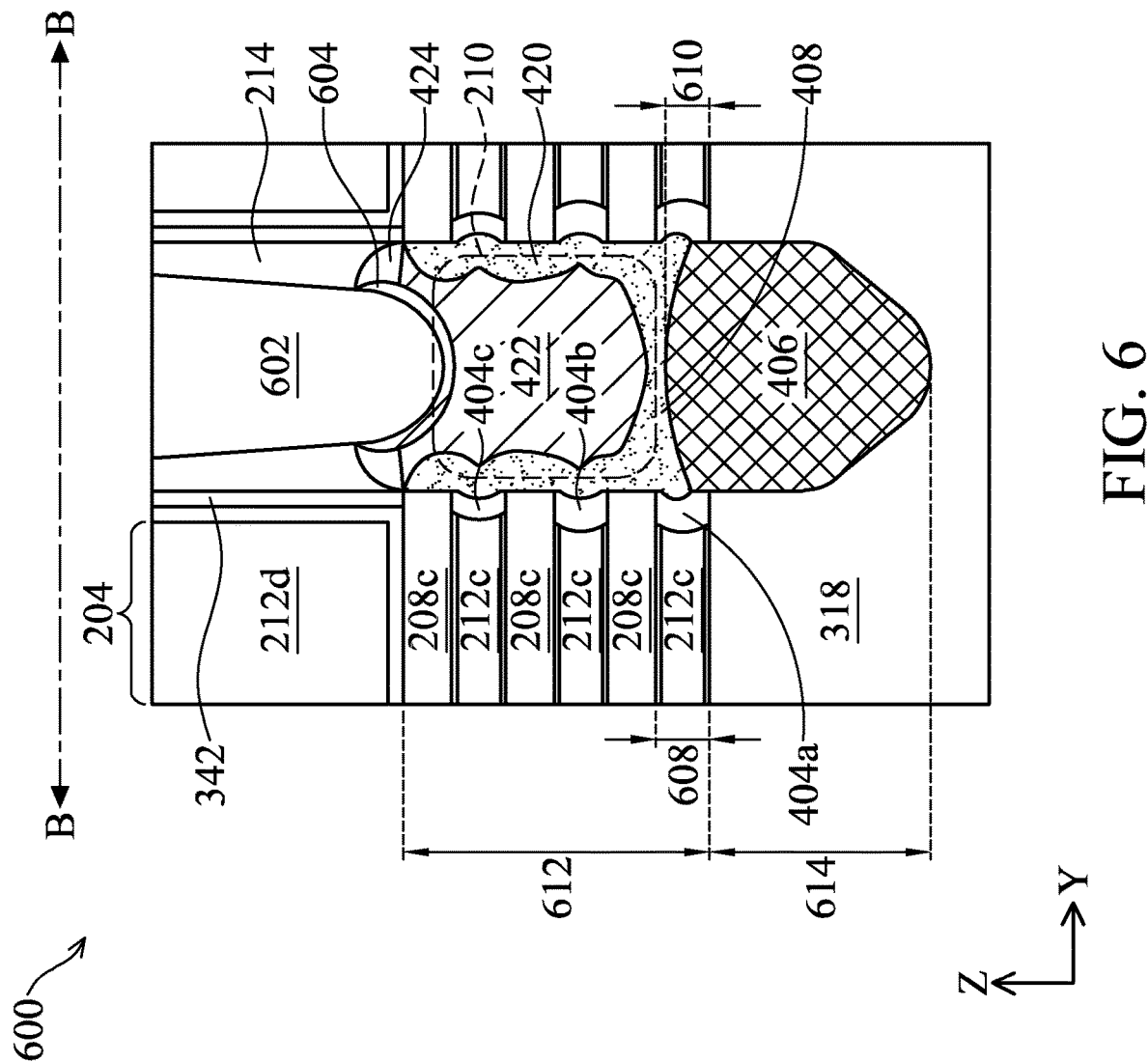

FIG. 6 is a diagram of an example implementation 600 described herein. FIG. 6 is illustrated from the perspective of the cross-sectional plane B-B in FIG. 3U and shows the buffer layer 406 in relation to features of the semiconductor device 200 after the replacement gate process described in connection with FIGS. 5A-5D. The gate structure 212 includes portions 212a, 212b, 212c, and 212d.

FIG. 6 includes a plurality of nanostructure channels 208 (e.g., nanostructure channels 208a, 208b, and 208c). In FIG. 6, inner spacer layers 404a, 404b, and 404c are respectively located on ends of the plurality of nanostructure channels 208. FIG. 6 further shows the buffer layer 406, the curved top surface 408, and the source/drain region 210 over the buffer layer 406. The source/drain region includes the layer 420 and the layer 422. The capping layer 424 is over the source drain region 210.

FIG. 6 further shows the dielectric layer 214 (e.g., formed over the source/drain region 210 during the replacement gate operation) and the spacer layers 342 remaining after removal of the dummy gate structure 336.

In FIG. 6, a source/drain contact 602 (referred to as an MD) is formed to the source/drain region 210 through the dielectric layer 214. To form the source/drain contact 602, a recess is formed through the dielectric layer 214 and to the source/drain region 210. In some implementations, the recess is formed in a portion of the source/drain region 210 such that the source/drain contact 602 extends into a portion of the source/drain region 210, as shown in the example in FIG. 6.

In some implementations, a pattern in a photoresist layer is used to form the opening. In these implementations, the deposition tool 102 forms the photoresist layer on the dielectric layer 214 and on the gate structures 212. The exposure tool 104 exposes the photoresist layer to a radiation source to pattern the photoresist layer. The developer tool 106 develops and removes portions of the photoresist layer to expose the pattern. The etch tool 108 etches into the dielectric layer 214 to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess based on a pattern.

A metal silicide layer 604 is formed on the source/drain region 210 in the recess prior to forming the source/drain contact 602. The deposition tool 102 may form the metal silicide layer 604 to decrease contact resistance between the source/drain region 210 and the source/drain contact 602. Moreover, the metal silicide layer 604 may protect the source/drain region 210 from oxidization and/or other contamination. The metal silicide layer 604 includes a titanium silicide (TiSi$_x$) layer or another type of metal silicide layer.

The source/drain contact 602 is then formed in the recess and on the metal silicide layer 604 over the source/drain region 210. The deposition tool 102 and/or the plating tool 112 deposits the source/drain contact 602 using a CVD technique, a PVD technique, an ALD technique, an electroplating technique, another deposition technique described above in connection with FIG. 1, and/or a deposition technique other than as described above in connection with FIG. 1. The source/drain contact 602 includes ruthenium (Ru), tungsten (W), cobalt (Co), and/or another metal.

In some implementations, and as shown in FIG. 6, the plurality of nanostructure channels 208a-208c are above a top surface of the portion 318 (e.g., a top surface of the mesa region). In some implementations, the plurality of the portions 212a-212c of the gate structure wrap around the plurality of the nanostructure channels 208a-208c. The source/drain region 210 is adjacent to the plurality of nanostructure channels 208a-208c and adjacent to the plurality of the portions 212a-212c.

FIG. 6 shows the inner spacer layer 404a on the bottom portion 212a of the gate structure. The bottom portion 212a of the gate structure may wrap around the fin structure 204 including the bottom nanostructure channel 208a. In some implementations, the inner spacer layer 404a is between the portion of the fin structure and the bottom second layer 306a (e.g., nanostructure channel) of the plurality of second layers 306a-306c. In FIG. 6, the buffer layer 406 (e.g., buffer region) is under the source/drain region 210.

In some implementations, and as shown, the curved top surface 408 of the buffer layer 406 includes an apex height that is greater relative to a height of a bottom surface of the inner spacer layer 404a. In some implementations, and as shown, the apex height of the curved top surface is lesser relative to a height of a top surface of the inner spacer layer 404a.

The inner spacer layer 404a may have a thickness 608. In some implementations, a distance 610 between the apex height and the bottom surface of the inner spacer layer 404a is in a range of approximately 50% to approximately 90% of the thickness 608 of the inner spacer layer 404a. If the distance 610 is less than this range, the buffer layer 406 may not effectively reduce leakage. If the distance 610 is greater than this range, effectiveness of the plurality of second layers 306a-306b may be reduced. However, other values and ranges for the distance 610 are within the scope of the present disclosure.

In some implementations, a distance 612 between the bottom surface of the inner spacer layer 404a and a top surface of the top second layer 306c (e.g., top nanostructure channel) is in a range of approximately 30 nanometers to approximately 80 nanometers. If the distance 612 is less than this range, the fin structure 204 may not accommodate enough nanostructure channels (e.g., the plurality of second layers 306a-306c) to improve transistor performance. If the distance 612 is greater than this range, production costs and defects within the semiconductor device 200 may be increased. However, other values and ranges for the distance 612 are within the scope of the present disclosure.

In some implementations, a distance 614 between the bottom surface of the inner spacer layer 404a and a bottom depth of the buffer layer 406 is in a range of approximately 10 nanometers to approximately 50 nanometers. If the distance 614 is less than this range, the buffer layer 406 may be non-functional. If the distance 614 is greater than this range, production costs and defects within the semiconductor device 200 may be increased. However, other values and ranges for the distance 614 are within the scope of the present disclosure.

The distance 612 (e.g., a first distance) may be greater relative to the distance 614 (e.g., a second distance). Alternatively, distance 612 may be lesser relative to distance 614.

As indicated above, the number and arrangement of operations and devices shown in FIG. 6 are provided as one or more examples. In practice, there may be additional operations and devices, fewer operations and devices, different operations and devices, or differently arranged operations and devices than those shown in FIG. 6.

Figure 7:
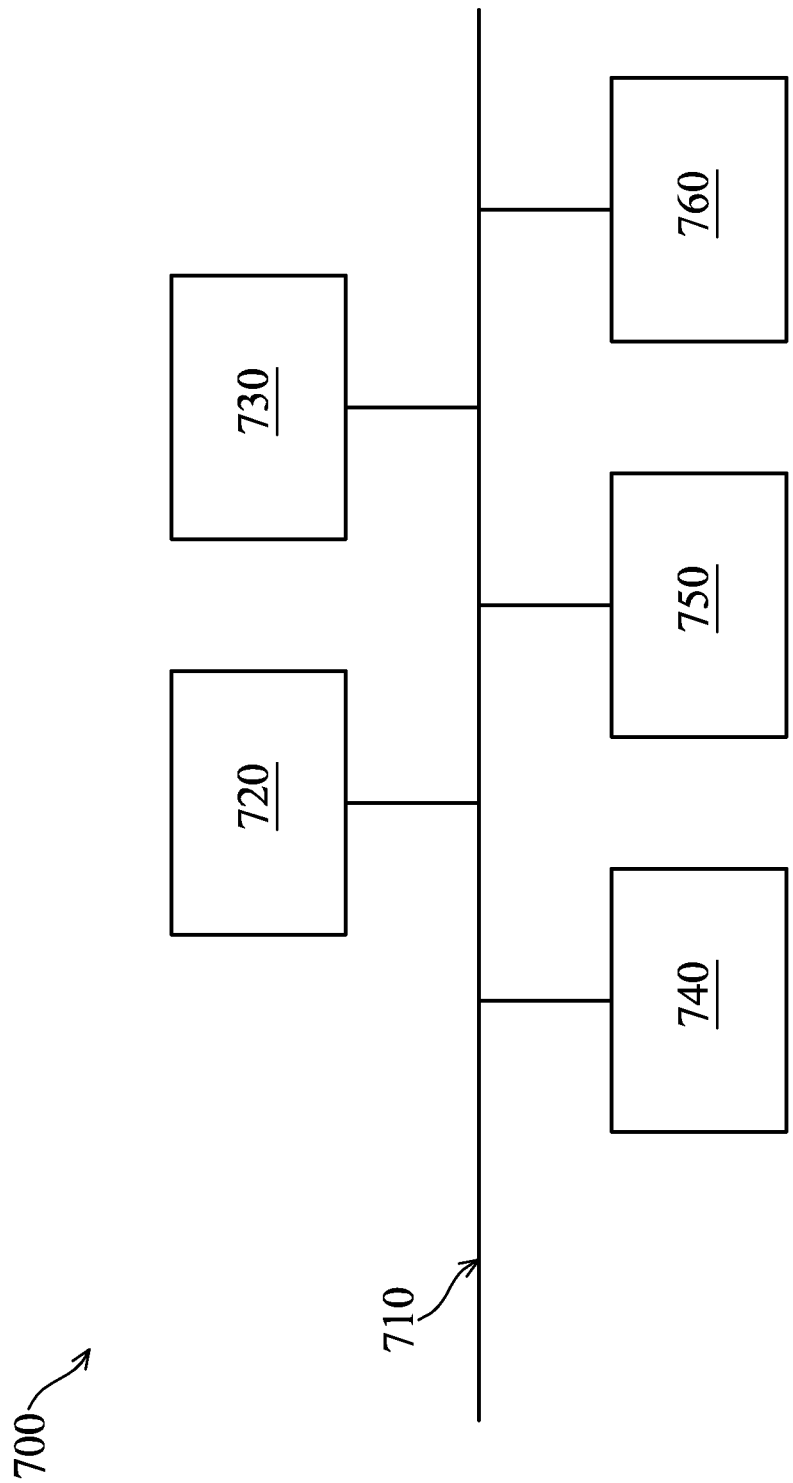
FIG. 7 is a diagram of example components of one or more devices described herein.

FIG. 7 is a diagram of example components of one or more devices 700 described herein. In some implementations, one or more of the semiconductor processing devices 102-112 and/or the wafer/die transport tool 114 may include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
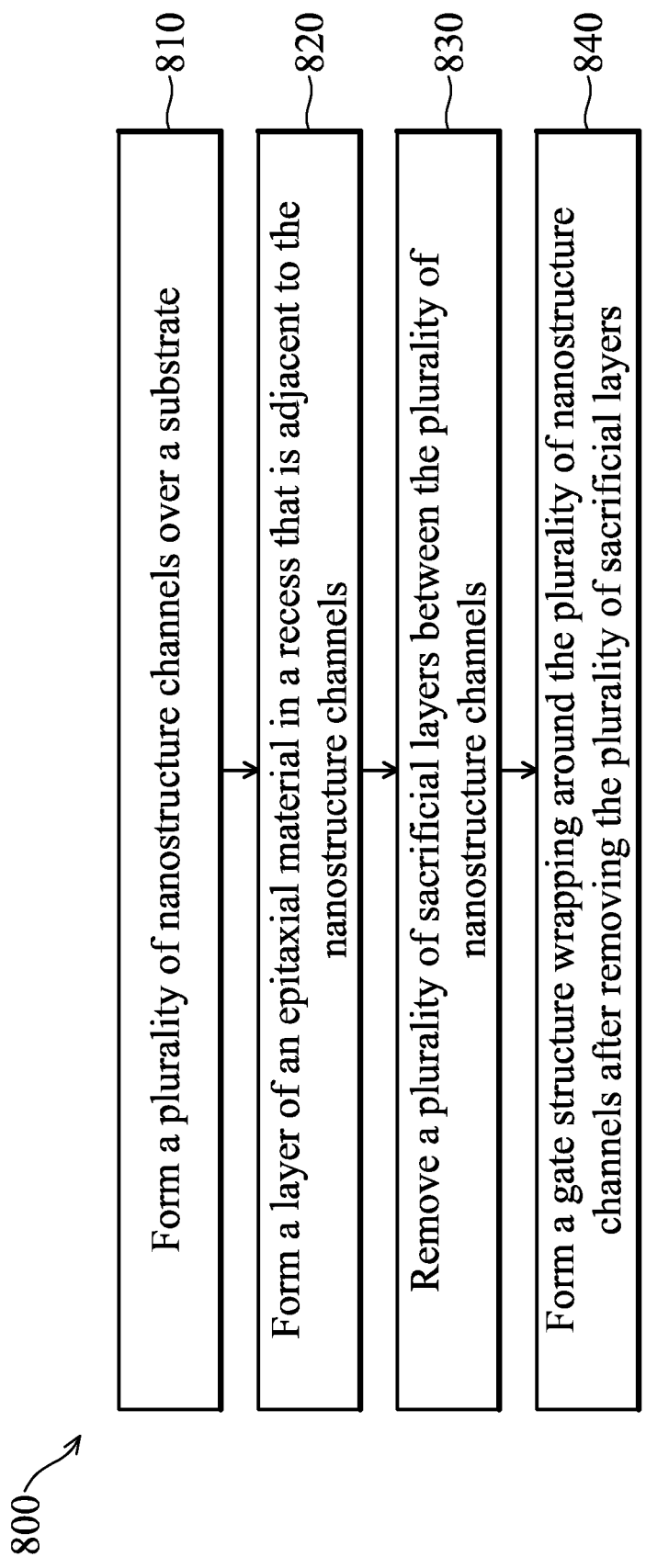
FIG. 8 is a flowchart of an example process associated with forming a semiconductor device described herein.

FIG. 8 is a flowchart of an example process 800 associated with forming a semiconductor device. In some implementations, one or more process blocks of FIG. 8 are performed by one or more semiconductor processing tools (e.g., one or more of the semiconductor processing tools 102-112). Additionally, or alternatively, one or more process blocks of FIG. 8 may be performed by one or more components of device 700, such as processor 720, memory 730, input component 740, output component 750, and/or communication component 760.

As shown in FIG. 8, process 800 may include forming a plurality of nanostructure channels over a substrate (block 810). For example, the one or more semiconductor processing tools 102-112 may form a plurality nanostructure channels 208 over the substrate (e.g., the semiconductor substrate 202) as described above. In some implementations, the plurality of nanostructure channels are arranged in a direction perpendicular to the substrate.

As further shown in FIG. 8, process 800 may include forming a layer of an epitaxial material in a recess that is adjacent to the nanostructure channels (block 820). For example, the one or more semiconductor processing tools 102-112 may form a layer of an epitaxial material (e.g., the buffer layer 406) in a recess 402 that is adjacent to the second layers 306a-306c, as described above. In some implementations, a portion 414a of the layer of the epitaxial material extends towards a hybrid fin structure 334a that is adjacent to the plurality of nanostructure channels 208 and into a shallow trench isolation region 206a.

As further shown in FIG. 8, process 800 may include removing a plurality of sacrificial layers between the plurality of nanostructure channels (block 830). For example, the one or more semiconductor processing tools 102-112 may remove a plurality of sacrificial layers (e.g. the first layers 304) from between the plurality of nanostructure channels 208.

As further shown in FIG. 8, process 800 may include forming a gate structure (block 840). For example, the one or more semiconductor processing tools 102-112 may form a gate structure 212 wrapping around the plurality of nanostructure channels 208 (e.g., the second layers 306a-306c) after removing the plurality of sacrificial layers (e.g., the first layers 304), as described above.

Process 800 may include additional implementations, such as any single implementation or any combination of implementations described below and/or in connection with one or more other processes described elsewhere herein.

In a first implementation, forming the layer of the epitaxial material includes performing a plurality of deposition and etch cycles to form a curved top surface 408 (e.g., a convex top surface) on the layer of the epitaxial material.

In a second implementation, alone or in combination with the first implementation, forming the layer of the epitaxial material includes forming the portion of the layer that extends towards the hybrid fin structure 334a to contact the hybrid fin structure.

In a third implementation, alone or in combination with one or more of the first and second implementations, process 800 includes forming a cladding layer 324 in the recess 402 prior to forming the layer of the epitaxial material, and removing portions of the cladding layer 324 to expose the hybrid fin structure 334a through the recess 402 prior to forming the layer of the epitaxial material.

In a fourth implementation, alone or in combination with one or more of the first through third implementations, forming the layer of the epitaxial material includes forming the portion of the layer to extend along a cross-section of the cladding layer 324.

In a fifth implementation, alone or in combination with one or more of the first through fourth implementations, process 800 includes forming a source/drain region 210 over the layer of the epitaxial material prior to forming the gate structure.

In a sixth implementation, alone or in combination with one or more of the first through fifth implementations, forming the source/drain region 210 over the layer of epitaxial material includes forming a second layer of a second epitaxial material (e.g., the layer 420) over the layer of the epitaxial material, and forming a third layer of a third epitaxial material (e.g., the layer 422) over the second layer. In some implementations, a concentration of a dopant of the third epitaxial material is greater relative to a concentration of a dopant of the second epitaxial material.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations described herein provide techniques and semiconductor devices in which a buffer layer is formed under a source/drain region of a device. A shape of the buffer layer may include a curved top surface having a height that extends to increase coverage of nanosheets of a fin structure of the device. The shape of the buffer layer also includes regions having widths that extend towards shallow trench isolation regions of the device.

In this way, a likelihood of dopants diffusing from the source/drain region into the mesa region of the fin structure is reduced. As a result, a performance of the device may be increased by decreasing short channel effects (e.g., DIBL), decreasing an off-current of the device, and decreasing leakage within the device.

As described in greater detail above, some implementations described herein provide a semiconductor device. The semiconductor device includes a plurality of nanostructure channels over a substrate. In some implementations, the plurality of nanostructure channels are arranged in a direction perpendicular to the substrate. The semiconductor device includes a gate structure wrapping around the plurality of nanostructure channels over the substrate. The semiconductor device includes a source/drain region adjacent to the plurality of nanostructure channels and adjacent to the plurality of portions of the gate structure. The semiconductor device includes an inner spacer layer disposed between a top surface of a mesa region and a bottom nanostructure channel of the plurality of nanostructure channels. The semiconductor device includes a buffer region under the source/drain region, where a curved top surface of the buffer region includes an apex height that is greater relative to a height of a bottom surface of the inner spacer layer, and where the apex height of the curved top surface is lesser relative to a height of a top surface of the inner spacer layer.

As described in greater detail above, some implementations described herein provide a method. The method includes forming a plurality of nanostructure channels over a substrate, where the plurality of nanostructure channels are arranged in a direction perpendicular to the substrate. The method includes forming a layer of an epitaxial material in a recess that is adjacent to the nanostructure channels, where a portion of the layer of the epitaxial material extends towards a hybrid fin structure that is adjacent to the fin structure and into a shallow trench isolation region. The method includes forming a gate structure wrapping around the plurality of nanostructure channels after removing the plurality of sacrificial layers.

As described in greater detail above, some implementations described herein provide a semiconductor device. The semiconductor device includes a bottom nanostructure channel over a substrate. The semiconductor device includes a first hybrid fin structure adjacent to a first side of the bottom nanostructure channel. The semiconductor device includes a second hybrid fin structure adjacent to a second side of bottom nanostructure channel that is opposite the first side. The semiconductor device includes a buffer region between the first hybrid fin structure and the second hybrid fin structure, where a first portion of the buffer region extends into a first shallow trench isolation region between the first side of the bottom nanostructure channel and the first hybrid fin structure, where a second portion of the buffer region extends into a second shallow trench isolation region that is between the second side of the bottom nanostructure channel and the second hybrid fin structure, and where a curved top surface of the buffer region includes an apex height that is greater relative to a height of a top surface of the first shallow trench isolation region, greater relative to a height of a top surface of the second shallow trench isolation region, and lesser relative to a height of a bottom surface of the bottom nanostructure channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a plurality of nanostructure channels over a substrate,
      wherein the plurality of nanostructure channels are arranged in a direction perpendicular to the substrate;
   a gate structure wrapping around the plurality of nanostructure channels over the substrate;
   a source/drain region adjacent to the plurality of nanostructure channels and the gate structure;
   an inner spacer layer disposed between a top surface of a mesa region and a bottom nanostructure channel of the plurality of nanostructure channels; and
   a buffer region under the source/drain region,
      wherein a curved top surface of the buffer region includes an apex height that is greater relative to a height of a bottom surface of the inner spacer layer, and
      wherein the apex height of the curved top surface is lesser relative to a height of a top surface of the inner spacer layer,
      wherein a first distance, between the bottom surface of the inner spacer layer and a top surface of a top nanostructure channel, is less relative to a second distance, between the bottom surface of the inner spacer layer and a bottom depth of the buffer region.

2. The semiconductor device of claim 1, wherein a distance between the apex height and the bottom surface of the inner spacer layer is in a range of approximately 50% to approximately 90% of a thickness of the inner spacer layer.

3. The semiconductor device of claim 1, wherein the first distance is in a range of approximately 30 nanometers to approximately 80 nanometers.

4. The semiconductor device of claim 1, wherein the second distance is in a range of approximately 10 nanometers to approximately 50 nanometers.

5. The semiconductor device of claim 1, further comprising:
   a plurality of hybrid fin structures, including a first hybrid fin structure and a second hybrid fin structure, adjacent to the bottom nanostructure channel,
      wherein the buffer region is between the first hybrid fin structure and the second hybrid fin structure.

6. The semiconductor device of claim 5, wherein:
   a first portion of the buffer region extends into a first shallow trench isolation region between a first nanostructure channel, of the plurality of nanostructure channels, and the first hybrid fin structure,
   wherein a second portion of the buffer region extends into a second shallow trench isolation region that is between the first nanostructure channel and the second hybrid fin structure.

7. A semiconductor device, comprising:
   a bottom nanostructure channel over a substrate;
   a first hybrid fin structure adjacent to a first side of the bottom nanostructure channel;
   a second hybrid fin structure adjacent to a second side of the bottom nanostructure channel that is opposite the first side; and
   a buffer region between the first hybrid fin structure and the second hybrid fin structure,
      wherein a first portion of the buffer region extends into a first shallow trench isolation region between the first side of the bottom nanostructure channel and the first hybrid fin structure,
      wherein a second portion of the buffer region extends into a second shallow trench isolation region that is between the second side of the bottom nanostructure channel and the second hybrid fin structure, and wherein a curved top surface of the buffer region includes an apex height that is greater relative to a height of a top surface of the first shallow trench isolation region, greater relative to a height of a top surface of the second shallow trench isolation region, and lesser relative to a height of a bottom surface of the bottom nanostructure channel.

8. The semiconductor device of claim 7, wherein the first portion of the buffer region extends from the first side of the bottom nanostructure channel towards the first shallow trench isolation region a distance that is in a range of approximately 3 nanometers to approximately 10 nanometers from the first side of the bottom nanostructure channel.

9. The semiconductor device of claim 7, wherein the first portion of the buffer region extends into a liner on a sidewall of the first hybrid fin structure.

10. The semiconductor device of claim 7, further comprising:
a bottom portion of a gate structure below the bottom nanostructure channel,
wherein the bottom portion of the gate structure wraps around a fin structure including the bottom nanostructure channel; and
a source/drain region above the buffer region,
wherein a shaped portion of the buffer region comprising the first portion, the second portion, and the curved top surface reduces a likelihood of dopants of the source/drain region from migrating into a mesa region below the bottom portion.

11. The semiconductor device of claim 10, wherein the apex height of the curved top surface extends above a bottom surface of the bottom portion.

12. The semiconductor device of claim 10, wherein a first width, from a side edge of the first portion to a side edge of the second portion, is greater relative to a second width of the source/drain region.

13. The semiconductor device of claim 12, wherein the first width is greater relative to the second width in a range of approximately 1 nanometer to approximately 10 nanometers.

14. A semiconductor device, comprising:
a bottom nanostructure channel over a substrate;
a plurality of hybrid fin structures, including a first hybrid fin structure and a second hybrid fin structure, adjacent to the bottom nanostructure channel; and
a buffer region between the first hybrid fin structure and the second hybrid fin structure,
wherein at least one of:
a first portion of the buffer region extends into a first shallow trench isolation region between the bottom nanostructure channel and the first hybrid fin structure, or
a second portion of the buffer region extends into a second shallow trench isolation region that is between the bottom nanostructure channel and the second hybrid fin structure.

15. The semiconductor device of claim 14, wherein the first portion of the buffer region extends a distance, from a first side of the bottom nanostructure channel towards the first shallow trench isolation region, that is in a range of approximately 3 nanometers to approximately 10 nanometers.

16. The semiconductor device of claim 14, wherein the first portion of the buffer region extends into a liner on a sidewall of the first hybrid fin structure.

17. The semiconductor device of claim 14, further comprising:
a gate structure comprising a bottom portion of the bottom nanostructure channel,
wherein the bottom portion of the gate structure wraps around a fin structure including the bottom nanostructure channel.

18. The semiconductor device of claim 14, further comprising:
a source/drain region above the buffer region.

19. The semiconductor device of claim 18, wherein a first width, from a side edge of the first portion to a side edge of the second portion, is greater relative to a second width of the source/drain region.

20. The semiconductor device of claim 19, wherein the first width is greater relative to the second width in a range of approximately 1 nanometer to approximately 10 nanometers.

* * * * *